US010600903B2

(12) United States Patent
Van Brunt et al.

(10) Patent No.: US 10,600,903 B2
(45) Date of Patent: *Mar. 24, 2020

(54) SEMICONDUCTOR DEVICE INCLUDING A POWER TRANSISTOR DEVICE AND BYPASS DIODE

(71) Applicant: Cree, Inc., Durham, NC (US)

(72) Inventors: Edward Robert Van Brunt, Raleigh, NC (US); Vipindas Pala, Morrisville, NC (US); Lin Cheng, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/032,919

(22) Filed: Sep. 20, 2013

(65) Prior Publication Data

US 2015/0084118 A1    Mar. 26, 2015

(51) Int. Cl.
*H01L 29/78* (2006.01)
*H01L 29/66* (2006.01)
(Continued)

(52) U.S. Cl.
CPC .... *H01L 29/7806* (2013.01); *H01L 29/66068* (2013.01); *H01L 29/66712* (2013.01);
(Continued)

(58) Field of Classification Search
CPC ............. H01L 29/7804; H01L 29/7805; H01L 29/7806; H01L 29/66068; H01L 29/66712;
(Continued)

(56) References Cited

U.S. PATENT DOCUMENTS 4,126,900 A    11/1978 Koomen et al.
4,803,533 A    2/1989 Chang et al.
(Continued)

FOREIGN PATENT DOCUMENTS

CN    1729577 A    2/2006
EP    0748520 A1   12/1996
(Continued)

OTHER PUBLICATIONS

Zhu et al., "Analytical Modeling of High-Voltage 4H—SiC Junction Barrier Schottky JBS Rectifiers", Aug. 2008, IEEE Transactions on Electron Devices 55, No. 8, pp. 1857-1863.*
(Continued)

*Primary Examiner* — Allen L Parker
*Assistant Examiner* — Pauline Vu
(74) *Attorney, Agent, or Firm* — Withrow & Terranova, P.L.L.C.

(57) ABSTRACT

A semiconductor device includes a vertical FET device and a Schottky bypass diode. The vertical FET device includes a gate contact, a source contact, and a drain contact. The gate contact and the source contact are separated from the drain contact by at least a drift layer. The Schottky bypass diode is coupled between the source contact and the drain contact and monolithically integrated adjacent to the vertical FET device such that a voltage placed between the source contact and the drain contact is distributed throughout the drift layer by the Schottky bypass diode in such a way that a voltage across each one of a plurality of P-N junctions formed between the source contact and the drain contact within the vertical FET device is prevented from exceeding a barrier voltage of the respective P-N junction.

11 Claims, 24 Drawing Sheets

(51) Int. Cl.
*H01L 29/47* (2006.01)
*H01L 29/06* (2006.01)
*H01L 29/08* (2006.01)
*H01L 29/10* (2006.01)
*H01L 29/16* (2006.01)

(52) U.S. Cl.
CPC ...... *H01L 29/0619* (2013.01); *H01L 29/0696* (2013.01); *H01L 29/0878* (2013.01); *H01L 29/1095* (2013.01); *H01L 29/1608* (2013.01); *H01L 29/47* (2013.01)

(58) Field of Classification Search
CPC ............. H01L 29/0696; H01L 29/1095; H01L 29/7788; H01L 29/7802; H01L 29/7803; H01L 29/47; H01L 29/0878; H01L 29/0619; H01L 29/1608; H01L 21/046; H01L 29/66734; H01L 29/782; H01L 29/26506; H01L 27/0766; H01L 29/66333; H01L 27/0761; H01L 27/0664; H01L 29/872; H01L 29/66143; H01L 2924/12032; H01L 29/66212

See application file for complete search history.

(56) References Cited

U.S. PATENT DOCUMENTS

| | | | |
|---|---|---|---|
| 4,967,243 A * | 10/1990 | Baliga et al. | 257/342 |
| 5,111,253 A * | 5/1992 | Korman | H01L 27/0727 |
| | | | 257/341 |
| 5,241,195 A | 8/1993 | Tu et al. | |
| 5,365,102 A | 11/1994 | Mehrotra et al. | |
| 5,378,911 A * | 1/1995 | Murakami | H01L 29/7392 |
| | | | 257/334 |
| 5,536,977 A * | 7/1996 | Williams | G06F 1/26 |
| | | | 257/392 |
| 5,661,314 A | 8/1997 | Merrill et al. | |
| 5,674,766 A | 10/1997 | Darwish et al. | |
| 5,689,144 A * | 11/1997 | Williams | 307/130 |
| 5,886,383 A * | 3/1999 | Kinzer | H01L 29/66712 |
| | | | 257/341 |
| 5,973,367 A * | 10/1999 | Williams | 257/365 |
| 6,057,558 A | 5/2000 | Yamamoto et al. | |
| 6,239,463 B1 | 5/2001 | Williams et al. | |
| 6,700,175 B1 | 3/2004 | Kodama et al. | |
| 6,979,863 B2 | 12/2005 | Ryu | |
| 7,221,010 B2 | 5/2007 | Ryu | |
| 7,498,633 B2 | 3/2009 | Cooper et al. | |
| 7,923,320 B2 | 4/2011 | Ryu | |
| 8,178,920 B2 | 5/2012 | Nakamura et al. | |
| 8,283,973 B2 * | 10/2012 | Hashimoto et al. | 327/537 |
| 8,415,671 B2 | 4/2013 | Zhang | |
| 8,492,827 B2 | 7/2013 | Ryu | |
| 8,575,692 B2 | 11/2013 | Yang et al. | |
| 9,331,197 B2 | 5/2016 | Pala et al. | |
| 2002/0038891 A1 | 4/2002 | Ryu et al. | |
| 2002/0047124 A1 * | 4/2002 | Kitabatake | H01L 27/0629 |
| | | | 257/73 |
| 2002/0125541 A1 | 9/2002 | Korec et al. | |
| 2003/0006452 A1 * | 1/2003 | Challa | H01L 21/763 |
| | | | 257/328 |
| 2003/0040144 A1 | 2/2003 | Blanchard et al. | |
| 2003/0080355 A1 | 5/2003 | Shirai et al. | |
| 2003/0178672 A1 | 9/2003 | Hatakeyama et al. | |
| 2003/0214011 A1 | 11/2003 | Jianjun et al. | |
| 2004/0099905 A1 | 5/2004 | Baliga | |
| 2004/0195618 A1 * | 10/2004 | Saito et al. | 257/330 |
| 2004/0212011 A1 | 10/2004 | Ryu | |
| 2004/0251503 A1 | 12/2004 | Hayashi et al. | |
| 2005/0035398 A1 * | 2/2005 | Williams et al. | 257/329 |
| 2005/0045960 A1 * | 3/2005 | Takahashi | H01L 29/0696 |
| | | | 257/368 |
| 2005/0082611 A1 * | 4/2005 | Peake | H01L 27/0727 |
| | | | 257/341 |
| 2005/0253190 A1 | 11/2005 | Okumura et al. | |
| 2006/0192256 A1 | 8/2006 | Cooper et al. | |
| 2006/0202264 A1 | 9/2006 | Bhalla et al. | |
| 2006/0214221 A1 * | 9/2006 | Challa et al. | 257/328 |
| 2007/0012983 A1 * | 1/2007 | Yang et al. | 257/301 |
| 2007/0034901 A1 | 2/2007 | Lui et al. | |
| 2007/0045655 A1 | 3/2007 | Song et al. | |
| 2007/0096237 A1 | 5/2007 | Zhao et al. | |
| 2007/0120201 A1 * | 5/2007 | Yamaguchi | H01L 29/0634 |
| | | | 257/401 |
| 2007/0145414 A1 | 6/2007 | Francis et al. | |
| 2007/0235745 A1 | 10/2007 | Hayashi et al. | |
| 2008/0012026 A1 | 1/2008 | Tsuji | |
| 2008/0029812 A1 | 2/2008 | Bhalla | |
| 2008/0050876 A1 | 2/2008 | Matocha et al. | |
| 2008/0128850 A1 | 6/2008 | Goerlach et al. | |
| 2008/0142811 A1 | 6/2008 | Matocha et al. | |
| 2008/0149963 A1 | 6/2008 | Adan | |
| 2008/0197439 A1 | 8/2008 | Goerlach et al. | |
| 2008/0206941 A1 | 8/2008 | Okuno et al. | |
| 2008/0230787 A1 | 9/2008 | Suzuki et al. | |
| 2008/0308838 A1 * | 12/2008 | McNutt et al. | 257/133 |
| 2009/0057757 A1 | 3/2009 | Hokomoto et al. | |
| 2009/0065814 A1 | 3/2009 | Bhalla et al. | |
| 2009/0072242 A1 | 3/2009 | Zhang | |
| 2009/0078971 A1 | 3/2009 | Treu et al. | |
| 2009/0079001 A1 * | 3/2009 | Salih et al. | 257/355 |
| 2009/0090920 A1 | 4/2009 | Endo et al. | |
| 2009/0146154 A1 | 6/2009 | Zhang et al. | |
| 2009/0173949 A1 | 7/2009 | Yatsuo et al. | |
| 2009/0179297 A1 | 7/2009 | Stewart et al. | |
| 2009/0189228 A1 | 7/2009 | Zhang et al. | |
| 2009/0218621 A1 * | 9/2009 | Pfirsch et al. | 257/342 |
| 2009/0230500 A1 * | 9/2009 | Yoshikawa et al. | 257/470 |
| 2009/0236612 A1 | 9/2009 | Nakamura et al. | |
| 2009/0272983 A1 | 11/2009 | Kumar et al. | |
| 2009/0283776 A1 * | 11/2009 | Iwamuro | 257/76 |
| 2009/0283798 A1 * | 11/2009 | Tsuzuki | H01L 21/26586 |
| | | | 257/140 |
| 2010/0013007 A1 | 1/2010 | Miyakoshi | |
| 2010/0025693 A1 | 2/2010 | Malhan et al. | |
| 2010/0073039 A1 * | 3/2010 | Kanai | H02M 7/5387 |
| | | | 327/110 |
| 2010/0078710 A1 * | 4/2010 | Willmeroth et al. | 257/329 |
| 2010/0093116 A1 | 4/2010 | Fronheiser et al. | |
| 2010/0176443 A1 | 7/2010 | Takaishi | |
| 2010/0219417 A1 | 9/2010 | Miura et al. | |
| 2010/0270586 A1 | 10/2010 | Ueno | |
| 2011/0049564 A1 * | 3/2011 | Guan | H01L 29/66325 |
| | | | 257/147 |
| 2011/0156810 A1 * | 6/2011 | Girdhar | H01L 29/7806 |
| | | | 327/566 |
| 2011/0193057 A1 | 8/2011 | Sabathil et al. | |
| 2011/0241068 A1 | 10/2011 | Watanabe et al. | |
| 2011/0254088 A1 | 10/2011 | Darwish et al. | |
| 2012/0025874 A1 * | 2/2012 | Saikaku et al. | 327/109 |
| 2012/0037955 A1 * | 2/2012 | Hirler | H01L 21/26506 |
| | | | 257/140 |
| 2012/0088339 A1 | 4/2012 | Molin et al. | |
| 2012/0187419 A1 * | 7/2012 | Elpelt | H01L 29/0843 |
| | | | 257/77 |
| 2012/0236615 A1 | 9/2012 | Kitabatake | |
| 2012/0256195 A1 | 10/2012 | Aketa | |
| 2012/0280258 A1 | 11/2012 | Yeh et al. | |
| 2012/0292742 A1 | 11/2012 | Itoh et al. | |
| 2012/0306009 A1 | 12/2012 | Kim | |
| 2012/0313212 A1 | 12/2012 | Sugawara | |
| 2013/0026493 A1 | 1/2013 | Cheng et al. | |
| 2013/0026568 A1 | 1/2013 | Bhalla | |
| 2013/0105889 A1 | 5/2013 | Fujiwara et al. | |
| 2013/0306983 A1 | 11/2013 | Nakano et al. | |
| 2013/0313635 A1 | 11/2013 | Nakano | |
| 2013/0341674 A1 | 12/2013 | Werber et al. | |
| 2014/0021484 A1 | 1/2014 | Siemieniec et al. | |
| 2014/0027781 A1 * | 1/2014 | Ryu | 257/77 |
| 2014/0048847 A1 | 2/2014 | Yamashita et al. | |
| 2014/0070268 A1 | 3/2014 | Yoshimura et al. | |
| 2014/0077311 A1 | 3/2014 | Simin et al. | |
| 2014/0117376 A1 | 5/2014 | Terano et al. | |

(56) References Cited

U.S. PATENT DOCUMENTS

| | | | |
|---|---|---|---|
| 2014/0203299 | A1 | 7/2014 | Aketa et al. |
| 2014/0252554 | A1 | 9/2014 | Liao |
| 2015/0041886 | A1 | 2/2015 | Pala et al. |
| 2015/0053920 | A1 | 2/2015 | Yen et al. |
| 2016/0211360 | A1 | 7/2016 | Pala et al. |

FOREIGN PATENT DOCUMENTS

| | | |
|---|---|---|
| EP | 0867943 A1 | 9/1998 |
| EP | 1576672 A2 | 9/2005 |
| FR | 2814855 A1 | 4/2002 |
| JP | S5742164 A | 3/1982 |
| JP | S6149474 A | 3/1986 |
| JP | H065867 A | 1/1994 |
| JP | 2007184434 A | 7/2007 |
| JP | 2012114104 A | 6/2012 |
| JP | 2013149837 A | 8/2013 |
| KR | 10-1020344 B1 | 3/2011 |
| TW | I330894 B | 9/2010 |
| WO | 2012137914 A1 | 10/2012 |
| WO | 2013014943 A2 | 1/2013 |

OTHER PUBLICATIONS

Sheng, K. et al., "A vertical SiC JFET with a monolithically integrated JBS diode", Jun. 2009, Power Semiconductor Devices & IC's, 2009, ISPSD 2009, 21st International Symposium on, pp. 255-258.*
Jang, T. et al., "Electrical Characteristics of Tantalum and Tantalum Carbide Schottky Diodes on n- and p-type Silicon Carbide as a Function of Temperature," Presented at the High Temperature Electronics Conference, Jun. 14-18, 1998, Albuquerque, NM, IEEE, pp. 280-286.
International Search Report and Written Opinion for International Patent Application No. PCT/US2014/056098, dated Nov. 21, 2014, 16 pages.
Agarwal, A. et al., "A New Degradation Mechanism in High-Voltage SiC Power MOSFETs," IEEE Electron Device Letters, vol. 28, No. 7, Jul. 2007, pp. 587-589.
Author Unknown, "The Industry's First SiC Power MOSFET with Internal SiC SBD Significantly Reduces Power Loss in Inverters and Requires Fewer Components," ROHM Semiconductor Website—Press Releases, Jul. 11, 2012, 3 pages, http://www.rohm.com/web/global/news-detail?news-title=the-industry-s-first%E2%80%BB-sic-power-mosfet-with-internal-sic-sbd&defaultGroupID=false.
Baliga, B. Jayant, "Chapter 8: Integral Diode," Advance Power MOSFET Concepts, Copyright: 2010, pp. 399-476, Springer Science+Business Media, LLC, London, England.
Bhatnagar, M. et al., "Effect of Surface Inhomogeneities on the Electrical Characteristics of SiC Schottky Contacts," IEEE Trans. Electron Devices, vol. 43, No. 1, Jan. 1996, pp. 150-156.
Author Unknown, "NextPowerS3 MOSFETs Offer Super-Fast Switching with Soft Recovery," PowerPulse.Net, Copyright: 2013, 3 pages, www.powerpulse.net/story.php?storyID=28455;s=091820131.
Baliga, B. Jayant, "Advanced Power Rectifier Concepts," First Edition, 2009, Springer Science + Business Media, LLC, pp. 29 and 72.
Baliga, B. Jayant, "Fundamentals of Power Semiconductor Devices," Second Edition, 2008 Springer US, p. 168.
Baliga, B. Jayant, "Advanced Power MOSFET Concepts," 2010, Springer Science + Business Media, LLC, Chapters 2, 3, and 8, pp. 23-117, 399-476.
International Search Report and Written Opinion for International Patent Application No. PCT/US20141056091, dated Feb. 16, 2015, 15 pages.
International Search Report and Written Opinion for International Patent Application No. PCT/US20141056093, dated Feb. 18, 2015, 15 pages.
International Search Report and Written Opinion for International Patent Application No. PCT/US20141056094, dated Feb. 18, 2015, 14 pages.
Non-Final Office Action for U.S. Appl. No. 14/032,718, dated Apr. 16, 2015, 18 pages.
Non-Final Office Action for U.S. Appl. No. 14/032,995, dated May 11, 2015, 13 pages.
International Preliminary Report on Patentability for International Patent Application No. PCT/US2014/056091, dated Mar. 31, 2016, 11 pages.
International Preliminary Report on Patentability for International Patent Application No. PCT/US2014/056093, dated Mar. 31, 2016, 12 pages.
International Preliminary Report on Patentabilty for International Patent Application No. PCT/US2014/056094, dated Mar. 31, 2016, 11 pages.
International Preliminary Report on Patentability for International Patent Application No. PCT/US2014/056098, dated Mar. 31, 2016, 10 pages.
Advisory Action and AFCP 2.0 Decision for U.S. Appl. No. 14/032,718, dated Mar. 29, 2016, 6 pages.
Final Office Action for U.S. Appl. No. 14/255,405, dated May 19, 2016, 15 pages.
Corrected Notice of Allowability for U.S. Appl. No. 14/032,995, dated Mar. 15, 2016, 6 pages.
Office Action and Search Report for Taiwanese Patent Application No. 103132520, dated Dec. 28, 2015, 11 pages.
Advisory Action for U.S. Appl. No. 14/032,718, dated Feb. 9, 2016, 5 pages.
Corrected Notice of Allowability for U.S. Appl. No. 14/032,995, datd Feb. 8, 2016, 5 pages.
Non-Final Office Action for U.S. Appl. No. 14/032,718, dated Jul. 1, 2016, 21 pages.
Final Office Action for U.S. Appl. No. 14/255,611, dated Jul. 5, 2016, 12 pages.
Sui, Y., et al., "On-State Characteristics of SiC power UMOSFETs on 115-µm drift Layers," Electron Device Letters, vol. 26, Issue 4, Apr. 2005, IEEE, pp. 255-257.
Wang, S.R. et al., "Double-Self-Aligned Short-Channel Power DMOSFETs in 4H—SiC," Device Research Conference, Jun. 22-24, 2009, University Park, PA, IEEE, pp. 277-278.
Non-Final Office Action for U.S. Appl. No. 13/962,295, dated Jul. 17, 2014, 8 pages.
Non-Final Office Action for U.S. Appl. No. 13/962,295, dated Dec. 18, 2014, 11 pages.
Final Office Action for U.S. Appl. No. 13/962,295, dated Jul. 23, 2015, 12 pages.
Advisory Action for U.S. Appl. No. 13/962,295, dated Oct. 30, 2015, 3 pages.
Notice of Allowance for U.S. Appl. No. 13/962,295, dated Dec. 22, 2015, 7 pages.
Non-Final Office Action for U.S. Appl. No. 15/087,406, dated Aug. 15, 2016, 26 pages.
Office Action and Search Report for Taiwanese Patent Application No. 103127134, dated Oct. 22, 2015, 15 pages.
Decision of Allowance for Taiwanese Patent Application No. 103127134, dated Feb. 26, 2016, 10 pages.
International Search Report and Written Opinion for PCT/US2014/049941, dated Oct. 22, 2014, 12 pages.
International Preliminary Report on Patentability for PCT/US2014/049941, dated Feb. 18, 2016, 8 pages.
Advisory Action for U.S. Appl. No. 14/255,405, dated Sep. 28, 2016, 4 pages.
Advisory Action for U.S. Appl. No. 14/255,611, dated Sep. 16, 2016, 4 pages.
Final Office Action for U.S. Appl. No. 14/032,718, dated Jan. 6, 2017, 21 pages.
Non-Final Office Action for U.S. Appl. No. 14/255,405, dated Nov. 18, 2016, 17 pages.
Non-Final Office Action for U.S. Appl. No. 14/255,611, dated Nov. 10, 2016, 15 pages.
Notice of Allowance for U.S. Appl. No. 15/087,406, dated Mar. 10, 2017, 9 pages.

(56) References Cited

OTHER PUBLICATIONS

Advisory Action for U.S. Appl. No. 14/255,405, dated Sep. 21, 2017, 6 pages.
Advisory Action for U.S. Appl. No. 14/255,611, dated Sep. 28, 2017, 6 pages.
Notice of Reasons for Rejection for Japanese Patent Application No. 2016-533399, dated Aug. 22, 2017, 12 pages.
Advisory Action for U.S. Appl. No. 14/032,718, dated Apr. 14, 2017, 6 pages.
Final Office Action for U.S. Appl. No. 14/255,405, dated Jul. 3, 2017, 16 pages.
Final Office Action for U.S. Appl. No. 14/255,611, dated Jun. 29, 2017, 19 pages.
Non-Final Office Action for U.S. Appl. No. 14/255,405, dated Dec. 29, 2017, 20 pages.
Decision to Grant a Patent for Japanese Patent Application No. 2016-533399, dated Feb. 6, 2018, 4 pages.
Non-Final Office Action for U.S. Appl. No. 14/032,718, dated Apr. 9, 2018, 17 pages.
Non-Final Office Action for U.S. Appl. No. 14/255,611, dated Mar. 29, 2018, 14 pages.
First Office Action for Chinese Patent Application No. 201480044619.0, dated Nov. 1, 2017, 10 pages.
Second Office Action for Chinese Patent Application No. 201480044619.0, dated May 2, 2018, 18 pages.
Final Office Action for U.S. Appl. No. 14/255,611, dated Nov. 2, 2018, 12 pages.
Final Office Action for U.S. Appl. No. 14/255,405, dated Nov. 2, 2018, 19 pages.
Third Office Action for Chinese Patent Application No. 201480044619.0, dated Sep. 13, 2018, 15 pages.
Final Office Action for U.S. Appl. No. 14/032,718, dated Nov. 26, 2018, 16 pages.
Non-Final Office Action for U.S. Appl. No. 15/970,148, dated Feb. 28, 2019, 14 pages.
Advisory Action for U.S. Appl. No. 14/032,718, dated Feb. 8, 2019, 5 pages.
Advisory Action for U.S. Appl. No. 14/255,405, dated Feb. 28, 2019, 3 pages.
Examination Report for European Patent Application No. 14752742.8, dated Jan. 4, 2019, 5 pages.
Decision on Rejection for Chinese Patent Application No. 201480044619.0, dated Jan. 22, 2019, 15 pages.
Final Office Action for U.S. Appl. No. 14/032,718, dated Oct. 23, 2015, 21 pages.
Non-Final Office Action for U.S. Appl. No. 14/255,405, dated Oct. 27, 2015, 15 pages.
Notice of Allowance for U.S. Appl. No. 14/032,995, dated Nov. 25, 2015, 11 pages.
Non-Final Office Action for U.S. Appl. No. 14/255,611, dated Nov. 2, 2015, 18 pages.
Notice of Reasons for Rejection for Japanese Patent Application No. 2018-041765, dated Jun. 25, 2019, 10 pages.
Final Office Action for U.S. Appl. No. 15/970,148, dated Jul. 23, 2019, 15 pages.
Non-Final Office Action for U.S. Appl. No. 14/032,718, dated Jul. 3, 2019, 13 pages.
Non-Final Office Action for U.S. Appl. No. 14/255,405, dated Jul. 5, 2019, 17 pages.
Notice of Allowance for U.S. Appl. No. 15/970,148, dated Nov. 8, 2019, 8 pages.
Notice of Reexamination for Chinese Patent Application No. 201480044619.0, dated Sep. 10, 2019, 14 pages.
Final Office Action for U.S. Appl. No. 14/032,718, dated Jan. 24, 2020, 14 pages.
Final Office Action for U.S. Appl. No. 14/255,405, dated Jan. 27, 2020, 14 pages.
Decision to Grant for Japanese Patent Application No. 2018-041765, dated Dec. 10, 2019, 4 pages.

* cited by examiner

SEMICONDUCTOR DEVICE INCLUDING A POWER TRANSISTOR DEVICE AND BYPASS DIODE

FIELD OF THE DISCLOSURE

The present disclosure relates to power transistors including a bypass diode.

BACKGROUND

Power transistor devices are often used to transport large currents and support high voltages. One example of a power transistor device is the power metal-oxide-semiconductor field-effect transistor (MOSFET). A power MOSFET has a vertical structure, wherein a source contact and a gate contact are located on a first surface of the MOSFET device that is separated from a drain contact by a drift layer formed on a substrate. Vertical MOSFETs are sometimes referred to as vertical diffused MOSFETs (VDMOS) or double-diffused MOSFETs (DMOSFETs). Due to their vertical structure, the voltage rating of a power MOSFET is a function of the doping level and thickness of the drift layer. Accordingly, high voltage power MOSFETs may be achieved with a relatively small footprint.

FIG. 1 shows a conventional power MOSFET device 10. The conventional power MOSFET device 10 includes an N-doped substrate 12, an N-doped drift layer 14 formed over the substrate 12, one or more junction implants 16 in the surface of the drift layer 14 opposite the substrate 12, and an N-doped junction gate field-effect transistor (JFET) region 18 between each one of the junction implants 16. Each one of the junction implants 16 is formed by an ion implantation process, and includes a P-doped deep well region 20, a P-doped base region 22, and an N-doped source region 24. Each deep well region 20 extends from a corner of the drift layer 14 opposite the substrate 12 downwards towards the substrate 12 and inwards towards the center of the drift layer 14. The deep well region 20 may be formed uniformly or include one or more protruding regions. Each base region 22 is formed in a shallow portion on the surface of the drift layer 14 opposite the substrate 12 within the boundaries of the deep well region 20. Each source region 24 is formed adjacent to the base region 22 in a shallow portion on the surface of the drift layer 14 opposite the substrate 12 within the boundaries of the deep well region 20. The JFET region 18 defines a channel width between each one of the junction implants 16.

A gate oxide layer 26 is positioned on the surface of the drift layer 14 opposite the substrate 12, and extends laterally between a portion of the surface of each source region 24, such that the gate oxide layer 26 partially overlaps and runs between the surface of each source region 24 in the junction implants 16. A gate contact 28 is positioned on top of the gate oxide layer 26. Two source contacts 30 are each positioned on the surface of the drift layer 14 opposite the substrate 12 such that each one of the source contacts 30 partially overlaps both the source region 24 and the deep well region 20 of one of the junction implants 16, respectively, and does not contact the gate oxide layer 26 or the gate contact 28. A drain contact 32 is located on the surface of the substrate 12 opposite the drift layer 14.

In operation, when a biasing voltage below the threshold voltage of the device is applied to the gate contact 28, and the P-N junction formed between each deep well region 20 and the drift layer 14 is reverse biased, the conventional power MOSFET device 10 is placed in an OFF state. In the OFF state of the conventional power MOSFET device 10, any voltage between the source and the drain contact is supported by the drift layer 14. Due to the vertical structure of the conventional power MOSFET device 10, large voltages may be placed between the source contacts 30 and the drain contact 32 without damaging the device.

FIG. 2 shows a three-dimensional representation of the conventional power MOSFET device 10 shown in FIG. 1. As shown in FIG. 2, the conventional power MOSFET device 10 is rectangular, essentially extending the two-dimensional representation shown in FIG. 1 into the page. As will be appreciated by those of ordinary skill in the art, the conventional power MOSFET device 10 may be tiled into or out of the page to form a conventional power MOSFET "stripe" including a plurality of conventional power MOSFET devices 10 connected in series. Further, additional power MOSFET devices may be laterally tiled with the conventional power MOSFET device 10, as shown in FIG. 3. FIG. 3 shows three conventional power MOSFET devices 10, each integrated directly adjacent to one another and connected in series. As will be appreciated by those of ordinary skill in the art, each one of the conventional power MOSFET devices 10 may be tiled into or out of the page to form a plurality of conventional power MOSFET "stripes." Arranging the conventional power MOSFET devices 10 in "stripes" allows a large number of conventional power MOSFET devices 10 to be integrated into a small area of semiconductor die, thereby saving space in a device in which the conventional power MOSFET devices 10 are integrated.

FIG. 4A shows operation of the conventional power MOSFET device 10 when the device is in an ON state (first quadrant) of operation. When a positive voltage is applied to the drain contact 32 relative to the source contacts 30 and the gate voltage increases over the threshold voltage of the device, an inversion layer channel 34 is formed at the surface of the drift layer 14 underneath the gate contact 28, thereby placing the conventional power MOSFET device 10 in an ON state of operation. In the ON state of operation of the conventional power MOSFET device 10, current (shown by the shaded region in FIG. 4) is allowed to flow from the drain contact 32 to the source contacts 30 of the device. An electric field presented by junctions formed between the deep well region 20, the base region 22, and the drift layer 14 constricts current flow in the JFET region 18 into a JFET channel 36. At a certain spreading distance from the inversion layer channel 34 when the electric field presented by the junction implants 16 is diminished, the flow of current is distributed laterally, or spread out in the drift layer 14.

FIG. 4B shows operation of the conventional power MOSFET device 10 when the device is operating in the third quadrant. When a voltage below the threshold voltage of the device is applied to the gate contact 28 of the conventional power MOSFET device 10 and a positive voltage is applied to the source contacts 30 relative to the drain contact 32 of the device, current will flow from the source contacts through each respective base region 22 and deep well region 20 and into the drift layer 14.

As current flows from the deep well region 20 into the drift layer 14 of the conventional power MOSFET device 10 while the device is operating in the third quadrant, stacking faults may occur. Stacking faults occur as a result of basal plane dislocations (BPDs) present in the drift layer 14 due to imperfections in the semiconductor materials and/or manufacturing defects. As current runs through one or more BPDs in the drift layer 14, the crystalline structure of the semiconductor material may be altered, thereby creating one or more stacking faults. The stacking faults may substantially degrade the performance of the conventional power MOSFET device 10. For example, the stacking faults may cause the resistance of one or more areas in the drift layer 14 of the conventional power MOSFET device 10 to increase substantially.

One possible way to prevent stacking faults in the conventional power MOSFET device 10 is with more stringent manufacturing or testing of each conventional power MOSFET device 10 to reduce or eliminate BPDs. However, such manufacturing or testing procedures are often impractical or impossible, due to cost or difficulty.

An additional way to prevent stacking faults in the conventional power MOSFET device 10 is by placing an external bypass diode between the source contacts 30 and the drain contact 32 of the conventional power MOSFET device 10. FIG. 5 shows the conventional power MOSFET device 10 connected to an external bypass diode 40. As will be appreciated by those of ordinary skill in the art, the external bypass diode 40 may be chosen to be a Schottky diode, because of the low barrier voltage afforded by such a device. The external bypass diode 40 includes an anode 42, a cathode 44, and a drift layer 46. The anode 42 of the external bypass diode 40 is coupled to the source contacts 30 of the conventional power MOSFET device 10. The cathode 44 of the external bypass diode 40 is coupled to the drain contact 32 of the conventional power MOSFET device 10. The anode 42 and the cathode 44 are separated from one another by the drift layer 46.

When a bias voltage below the threshold voltage of the conventional power MOSFET device 10 is applied to the gate contact 28 of the device, and the junction between each deep well region 20 and the drift layer 14 is reverse biased, the conventional power MOSFET device 10 is placed in an OFF state and the external bypass diode 40 is placed in a reverse bias mode of operation. In the reverse bias mode of operation of the external bypass diode 40, current does not flow through the device.

FIG. 6A shows operation of the conventional power MOSFET device 10 including the external bypass diode 40 when the conventional power MOSFET device 10 is operating in on ON state (first quadrant) of operation. When a positive voltage is applied to the drain contact 32 relative to the source contacts 30 and the gate voltage increases over the threshold voltage of the device, the conventional power MOSFET is placed in an ON state (first quadrant) of operation, and the external bypass diode 40 is placed in a reverse bias mode of operation. In the ON state (first quadrant) of operation of the conventional power MOSFET device 10, current is allowed to flow between the drain contact 32 and the source contacts 30 of the device. As a result of the respective electric fields presented by the deep well regions 20, the current is constricted into a JFET channel. At a certain vertical distance when the electric fields presented by the deep well regions 20 become less pronounced, the current laterally spreads to fill the drift layer 14. Because the external bypass diode 40 is reverse biased, current does not flow from through the device.

FIG. 6B shows operation of the conventional power MOSFET device 10 including the external bypass diode 40 when the conventional power MOSFET device 10 is operating in the third quadrant. When a voltage below the threshold voltage of the conventional power MOSFET device 10 is applied to the gate contact 28 and a positive voltage is applied to the source contacts 30, the conventional power MOSFET device 10 begins to operate in the third quadrant, while the external bypass diode 40 is placed in a forward bias mode of operation. In the forward bias mode of operation of the external bypass diode 40, current (shown by the shaded region in FIG. 6) flows from the anode 42 into the drift layer 46, where it is delivered to the cathode 44 of the external bypass diode 40. Although the external bypass diode 40 creates a low impedance path for current flow between the source contacts 30 and the drain contact 32, a small amount of current may still flow through each one of the deep well regions 20 and into the drift layer 14 of the conventional power MOSFET device 10. This may be due at least in part to the inductance associated with the connections between the external bypass diode 40 and the conventional power MOSFET device 10 and the packaging of the external bypass diode 40.

By creating a high-speed, low-impedance path for current flow around the drift layer 14 of the conventional power MOSFET device 10, the overall current through the drift layer 14 can be substantially reduced. However, even a small amount of current flow in the drift layer 14 while the conventional power MOSFET device 10 is operating in the third quadrant may generate stacking faults over a long enough period of time, thereby significantly degrading the performance of the device. Although the area of the external bypass diode 40 can be increased in an attempt to prevent current flow through the P-N junctions in the conventional power MOSFET device 10 altogether, the area required by the external bypass diode 40 for such a solution is impractical for most applications.

Accordingly, there is a need for a power MOSFET device including a bypass diode that effectively prevents current flow through the drift layer of the power MOSFET device, while minimizing the total area of the device.

SUMMARY

The present disclosure relates to a semiconductor device including a vertical field-effect transistor (FET) device and a bypass diode for preventing current flow through one or more P-N junctions formed within the vertical FET device. According to one embodiment, the semiconductor device includes the vertical FET device and the bypass diode. The vertical FET device includes a gate contact, a source contact, and a drain contact. The gate contact and the source contact are separated from the drain contact by at least a drift layer. The bypass diode is coupled between the source contact and the drain contact and monolithically integrated adjacent to the vertical FET device such that a voltage placed between the source contact and the drain contact is distributed throughout the drift layer by the bypass diode in such a way that a voltage across each P-N junction formed between the source contact and the drain contact within the vertical FET device is prevented from exceeding the barrier voltage of the respective P-N junction. By integrating the bypass diode in such a way, current flow through each P-N junction formed between the source contact and the drain contact of the vertical FET device is effectively diverted through the bypass diode, thereby preventing the formation of stacking faults and improving the longevity and performance of the vertical FET device.

According to one embodiment, the bypass diode is a Schottky diode formed by placing a Schottky metal in contact with the drift layer.

According to an additional embodiment, the distance between the bypass diode and the furthest edge of a P-N junction formed between the source contact and the drain contact of the vertical FET device does not exceed 15 microns.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 7:
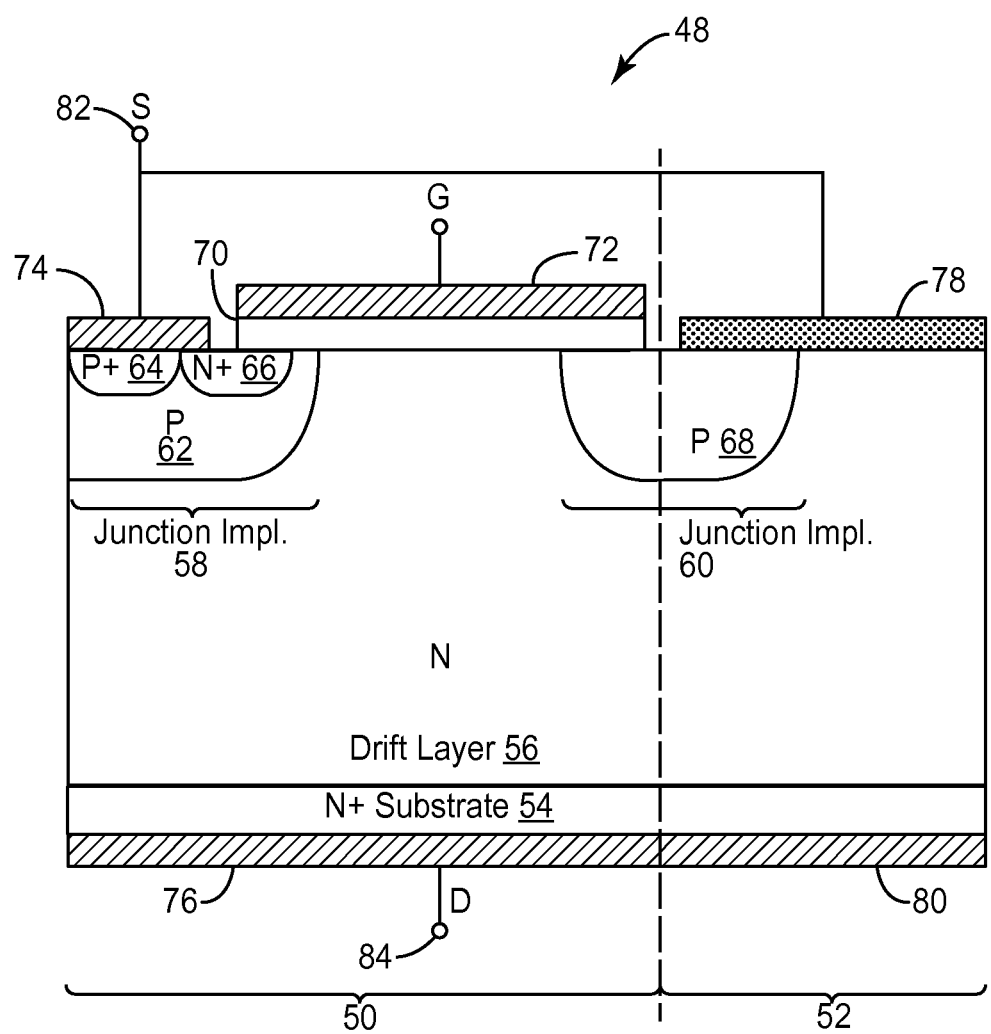
FIG. 7 shows a schematic representation of a vertical field-effect transistor (FET) device and bypass diode according to one embodiment of the present disclosure.

Turning now to FIG. 7, a semiconductor device 48 is shown including a vertical field-effect transistor (FET) device 50 and a monolithically integrated bypass diode 52 according to one embodiment of the present disclosure. The vertical FET device 50 may be a metal-oxide-semiconductor field-effect transistor (MOSFET) half-cell including a substrate 54, a drift layer 56 formed over the substrate 54, a first junction implant 58 in the surface of the drift layer 56 opposite the substrate 54, and a second junction implant 60 laterally separated from the first junction implant 58 in the surface of the drift layer 56 opposite the substrate 54. The first junction implant 58 may be formed by an ion implantation process, and includes a first deep well region 62, a first base region 64, and a first source region 66. The first deep well region 62 extends from a corner of the drift layer 56 opposite the substrate 54 downwards towards the substrate 54 and inwards towards the center of the drift layer 56. The first deep well region 62 may be formed uniformly or include one or more protruding regions. The first base region 64 is formed in a shallow portion on the surface of the drift layer 56 opposite the substrate within the boundaries of the first deep well region 62. The first source region 66 is formed adjacent to the first base region 64 in a shallow portion on the surface of the drift layer 56 opposite the substrate 54 within the boundaries of the first deep well region 62. The second junction implant 60 includes a second deep well region 68, which is laterally separated from the first deep well region 62 of the first junction implant 58 in the surface of the drift layer 56 opposite the substrate 54.

A gate oxide layer 70 is positioned on the surface of the drift layer 56 opposite the substrate 54, and extends laterally between a portion of the surface of the first source region 66 and a portion of the second deep well region 68, such that the gate oxide layer 70 partially overlaps and runs between the surface of the first source region 66 of the first junction implant 58 and the second deep well region 68 of the second junction implant 60. A gate contact 72 is positioned on top of the gate oxide layer 70. A source contact 74 is positioned on the surface of the drift layer 56 opposite the substrate 54, and extends laterally to overlap a portion of the first base region 64 and the first source region 66 of the first junction implant 58. A drain contact 76 is located on the surface of the substrate 54 opposite the drift layer 56.

The bypass diode 52 is formed adjacent to the vertical FET device 50 on the same semiconductor die. According to one embodiment, the bypass diode 52 is a Schottky diode including the substrate 54, the drift layer 56, at least a portion of the second deep well region 68, an anode 78, and a cathode 80. The anode 78 is located on the surface of the drift layer 56 opposite the substrate 54, such that the anode 78 partially overlaps a portion of the drift layer 56 and the second deep well region 68, without contacting the gate oxide layer 70 or the gate contact 72 of the vertical FET device 50. The cathode 80 is joined with the drain contact 76 of the vertical FET device 50 on the surface of the substrate 54 opposite the drift layer 56. The anode 78 and the source contact 74 of the vertical FET device 50 may be electrically coupled to an input node 82. The cathode 80 and the drain contact 76 of the vertical FET device 50 may be coupled to an output node 84.

According to one embodiment, the bypass diode 52 is formed adjacent to the vertical FET device 50 such that the bypass diode 52 is between no more than about 5-15 microns from the furthest edge of the P-N junction formed between the first deep well region 62 and the drift layer 56. As will be discussed in further detail below, by placing the bypass diode 52 in such close proximity to the P-N junction formed between the first deep well region 62 and the drift layer 56, the potential across this junction can be kept below the barrier voltage of the junction. That is, the P-N junction formed between the first deep well region 62 and the drift layer 56 can be prevented from entering a forward bias mode of operation. If the P-N junction formed between the first deep well region 62 and the drift layer 56 does not enter a forward bias mode of operation, current does not flow through the junction. Accordingly, stacking faults are not formed in the drift layer 56, thereby improving the performance and longevity of the device. Further, placing the bypass diode 52 in this manner allows the area of the bypass diode 52 to be kept quite low when compared with conventional solutions, on the order of 1.0-10.0 microns$^2$, while still preventing the flow of current through the P-N junction formed between the first deep well region 62 and the drift layer 56.

The vertical FET device 50 may be, for example, a silicon carbide (SiC) device. Those of ordinary skill in the art will appreciate that the concepts of the present disclosure may be applied to any materials system. The substrate 54 may be about 50.0-500.0 microns thick. The drift layer 56 may be about 3.5-250.0 microns thick, depending upon the voltage rating of the vertical FET device 50. The first deep well region 62 and the second deep well region 68 may be about 1.0-2.0 microns thick. Further, the semiconductor device 48 may include any number of additional layers without departing from the principles of the present disclosure. For example, the vertical FET device 50 may include a junction field-effect transistor (JFET) region between the first junction implant 58 and the second junction implant 60.

According to one embodiment, the substrate 54 is an N-doped layer with a doping concentration about $1 \times 10^{18}$ cm$^{-3}$ to $1 \times 10^{20}$ cm$^{-3}$. The drift layer 56 may be an N-doped layer with a doping concentration about $3 \times 10^{14}$ cm$^{-3}$ to $1.5 \times 10^{16}$ cm$^{-3}$. The first deep well region 62 and the second deep well region 68 may be heavily P-doped regions with a doping concentration about $5 \times 10^{17}$ cm$^{-3}$ to $1 \times 10^{20}$ cm$^{-3}$. The first base region 64 may be a P-doped region with a doping concentration about $5 \times 10^{16}$ cm$^{-3}$ to $1 \times 10^{19}$ cm$^{-3}$. The first source region 66 may be an N-doped region with a doping concentration about $1 \times 10^{19}$ cm$^{-3}$ to $1 \times 10^{21}$ cm$^{-3}$. The N-doping agent may be nitrogen, phosphorous, or any other suitable element or combination thereof, as will be appreciated by those of ordinary skill in the art. The P-doping agent may be aluminum, boron, or any other suitable element or combination thereof, as will be appreciated by those of ordinary skill in the art.

The gate contact 72, the source contact 74, the drain contact 76, and the cathode 80 may be comprised of multiple layers. For example, each one of the contacts may include a first layer of nickel or nickel-aluminum, a second layer of titanium over the first layer, a third layer of titanium-nickel over the second layer, and a fourth layer of aluminum over the third layer. The anode 78 may comprise titanium, tantalum, or any other suitable low-barrier Schottky metal. Those of ordinary skill in the art will appreciate that the gate contact 72, the source contact 74, the drain contact 76, the anode 78, and the cathode 80 may comprise any suitable material without departing from the principles of the present disclosure.

As will be appreciated by those of ordinary skill in the art, in certain applications the bypass diode 52 may be connected in opposite polarity, wherein the anode 78 is coupled to the drain contact 76 of the vertical FET device 50 and the cathode 80 is coupled to the source contact 74 of the vertical FET device 50. This may occur, for example, when the vertical FET device 50 is a P-MOSFET device.

Figure 1:
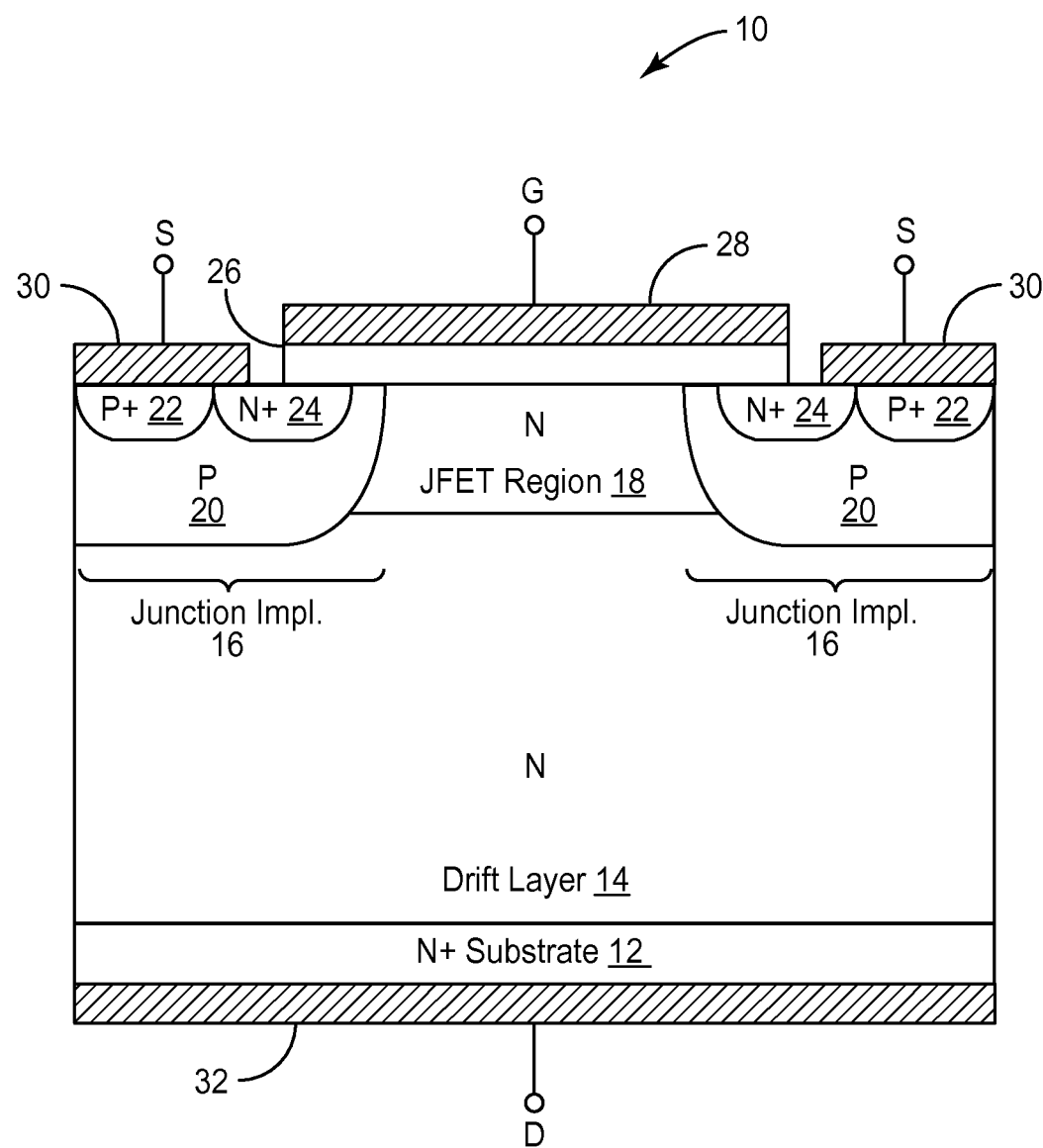
FIG. 1 shows a schematic representation of a conventional power metal-oxide-semiconductor field-effect transistor (MOSFET) device.
Figure 2:
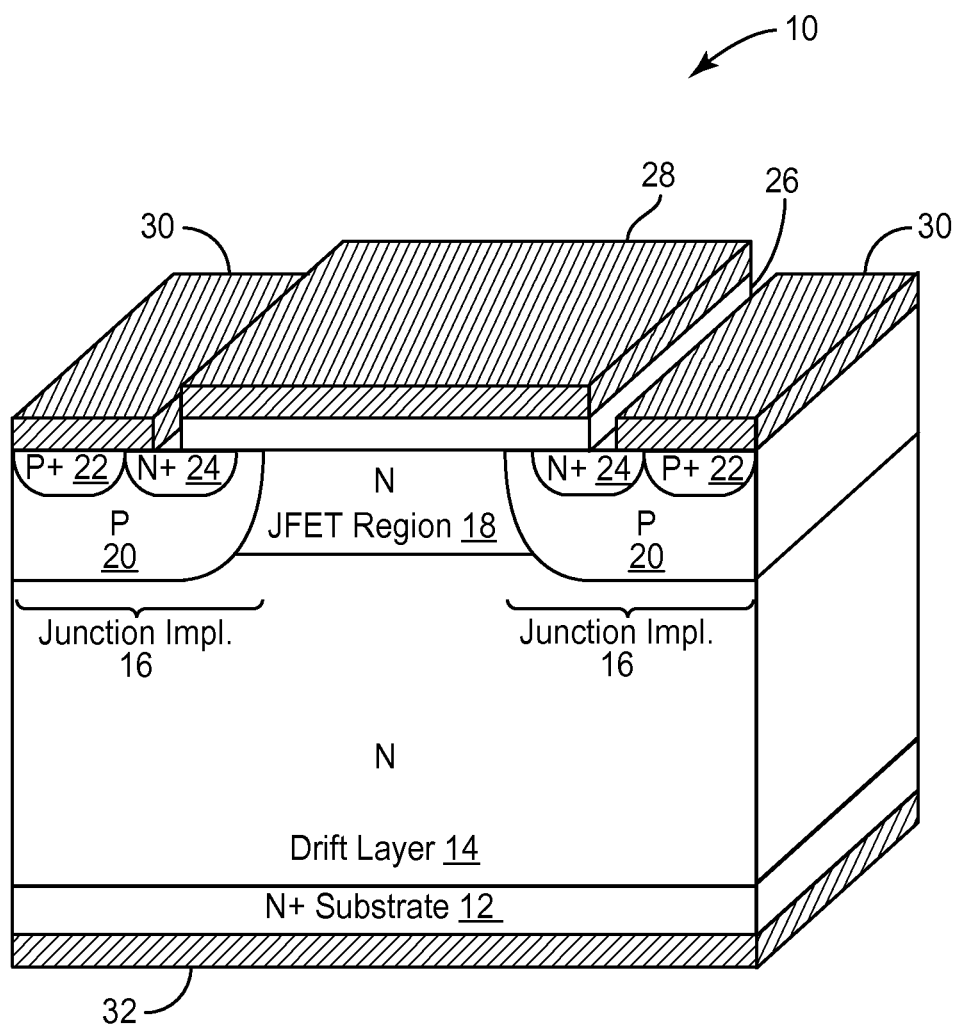
FIG. 2 shows a three-dimensional representation of the conventional power MOSFET device shown in FIG. 1.
Figure 3:
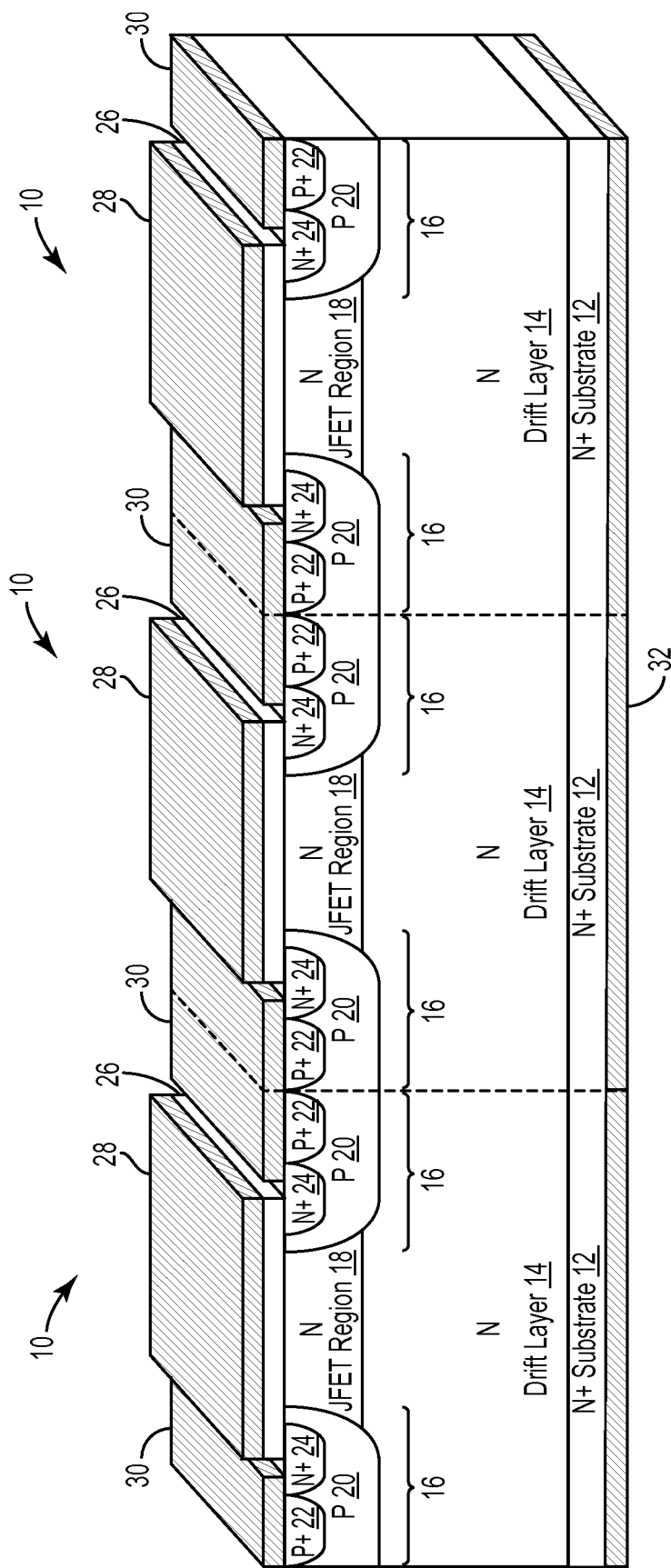
FIG. 3 shows a plurality of conventional power MOSFET devices integrated adjacent to one another in order to form a plurality of MOSFET "stripes."
Figure 4A:
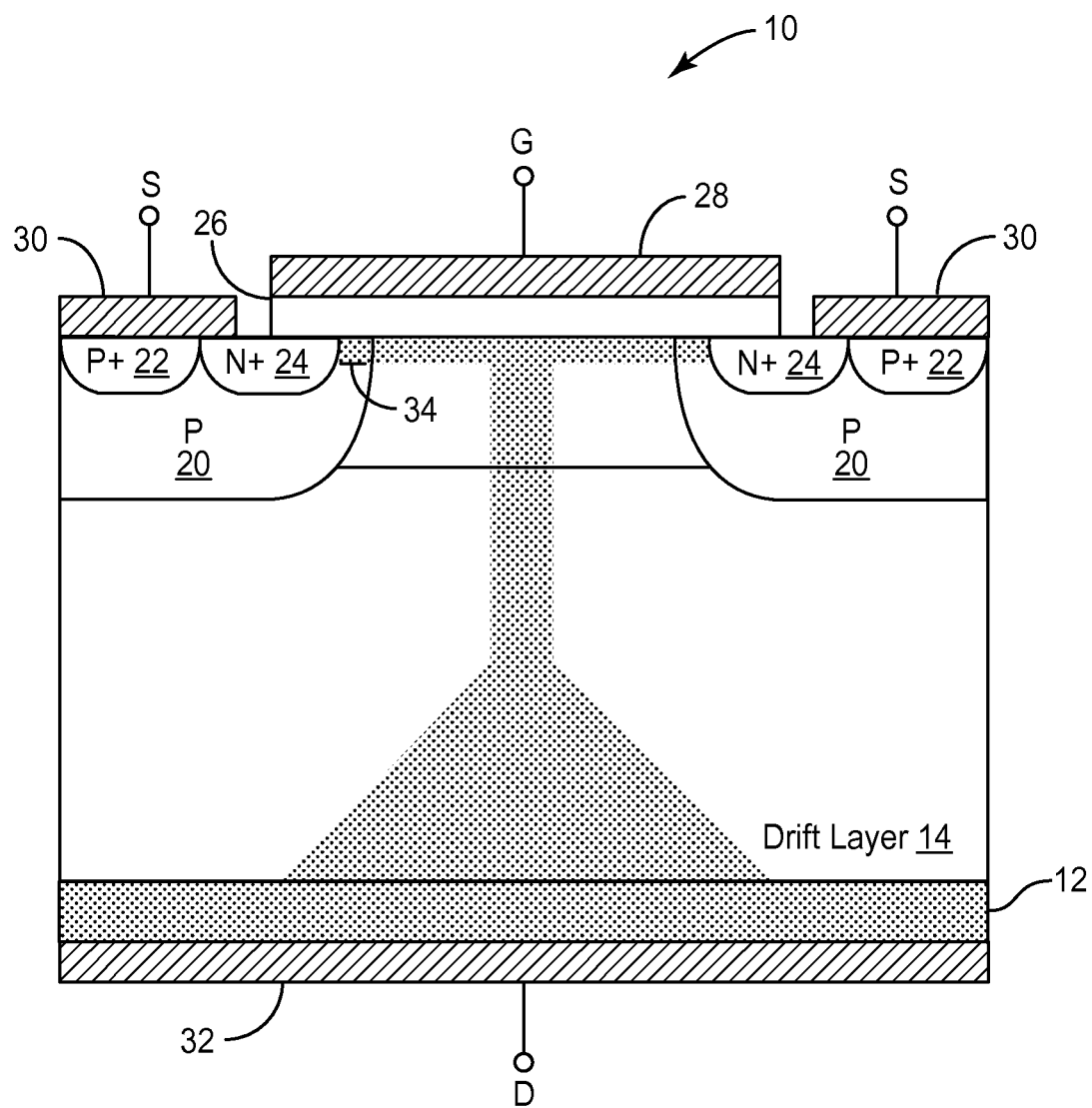
FIG. 4A shows details of the operation of the conventional power MOSFET device shown in FIG. 1 when the device is in an ON state (first quadrant) of operation.
Figure 4B:
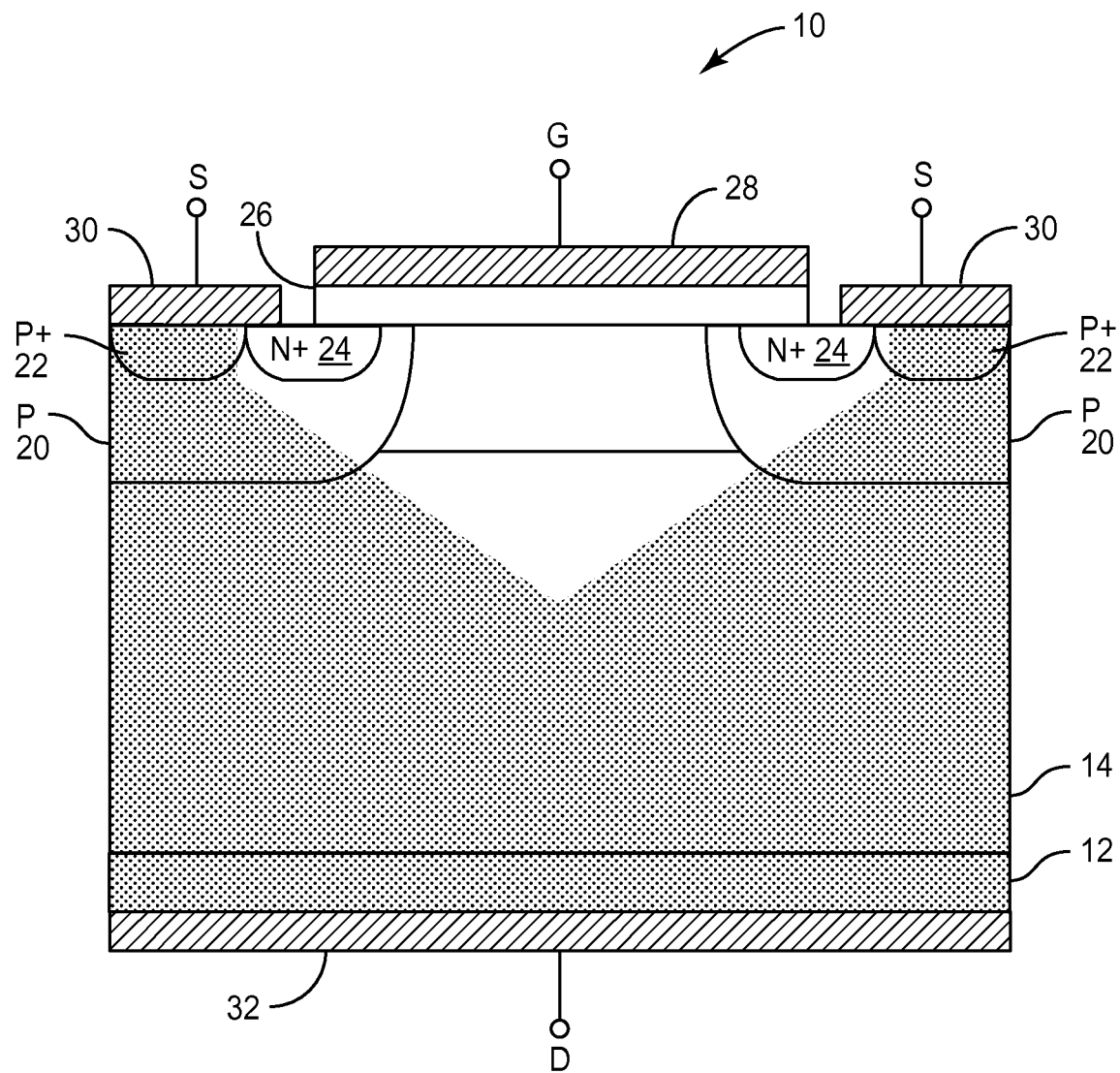
FIG. 4B shows details of the operation of the conventional power MOSFET device shown in FIG. 1 when the device is operating in the third quadrant.
Figure 5:
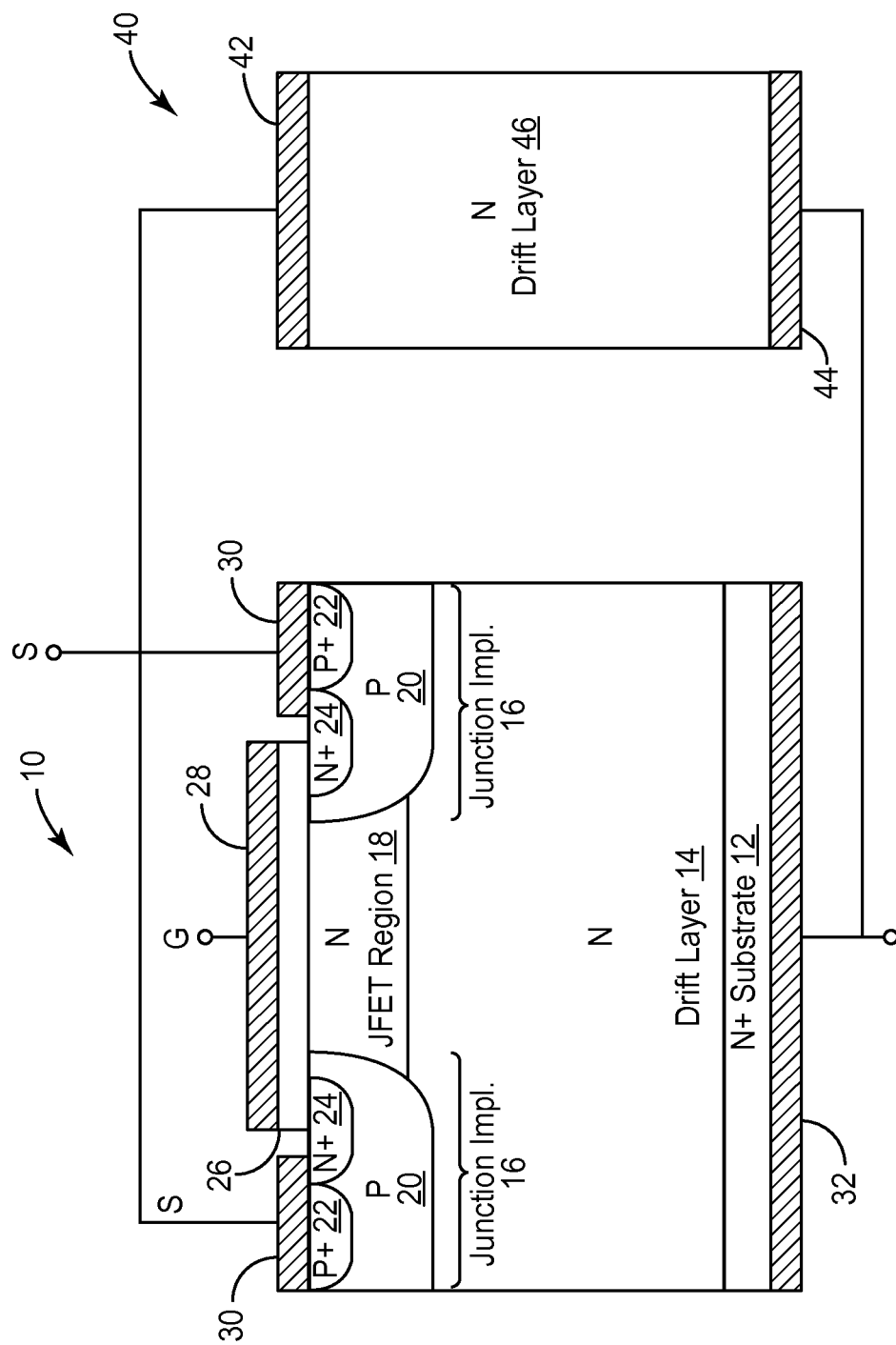
FIG. 5 shows a schematic representation of the conventional power MOSFET device shown in FIG. 1 attached to an external bypass diode.
Figure 6A:
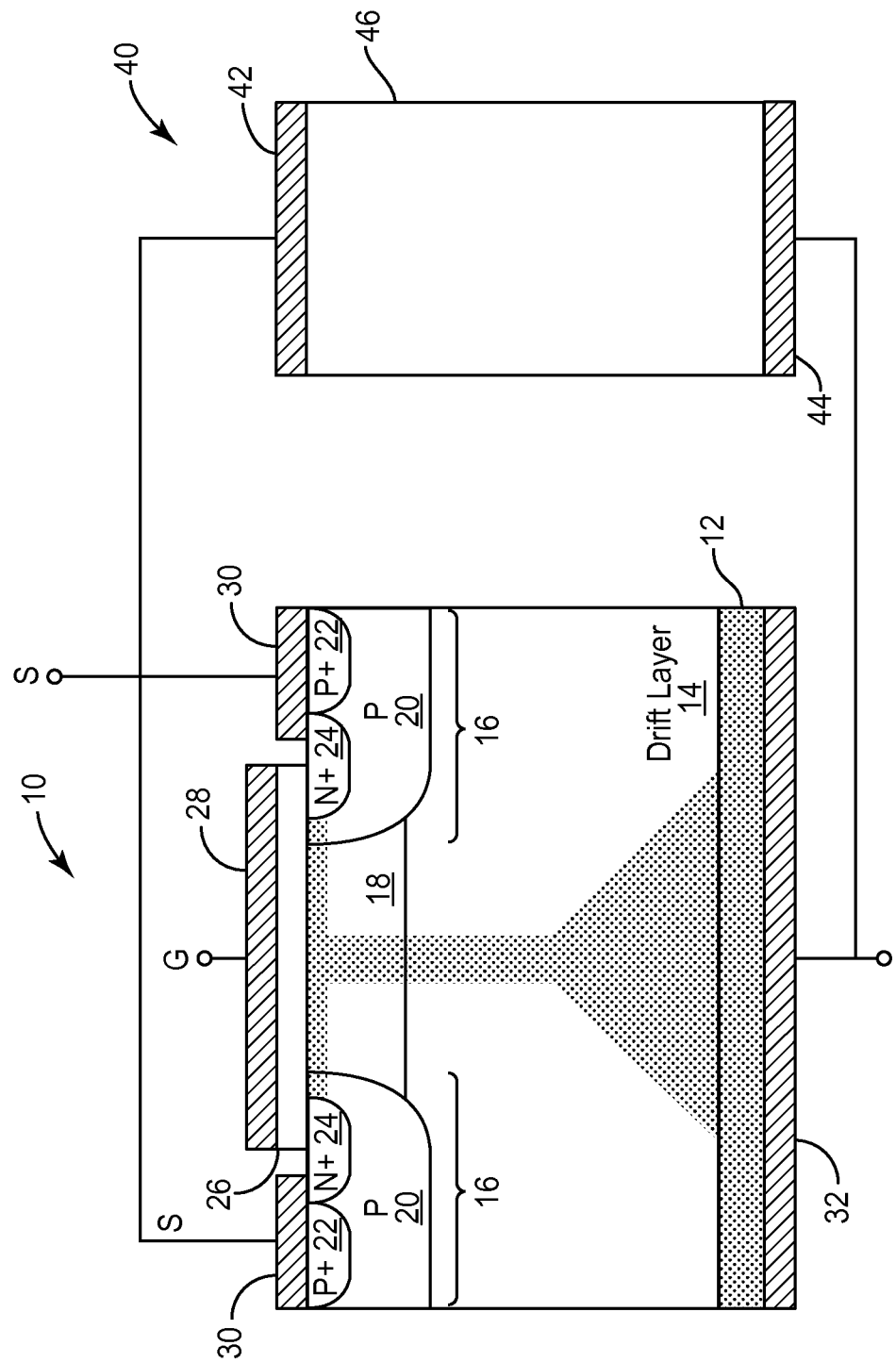
FIG. 6A shows details of the operation of the conventional power MOSFET device and attached external bypass diode when the device is in an ON state (first quadrant) of operation.
Figure 6B:
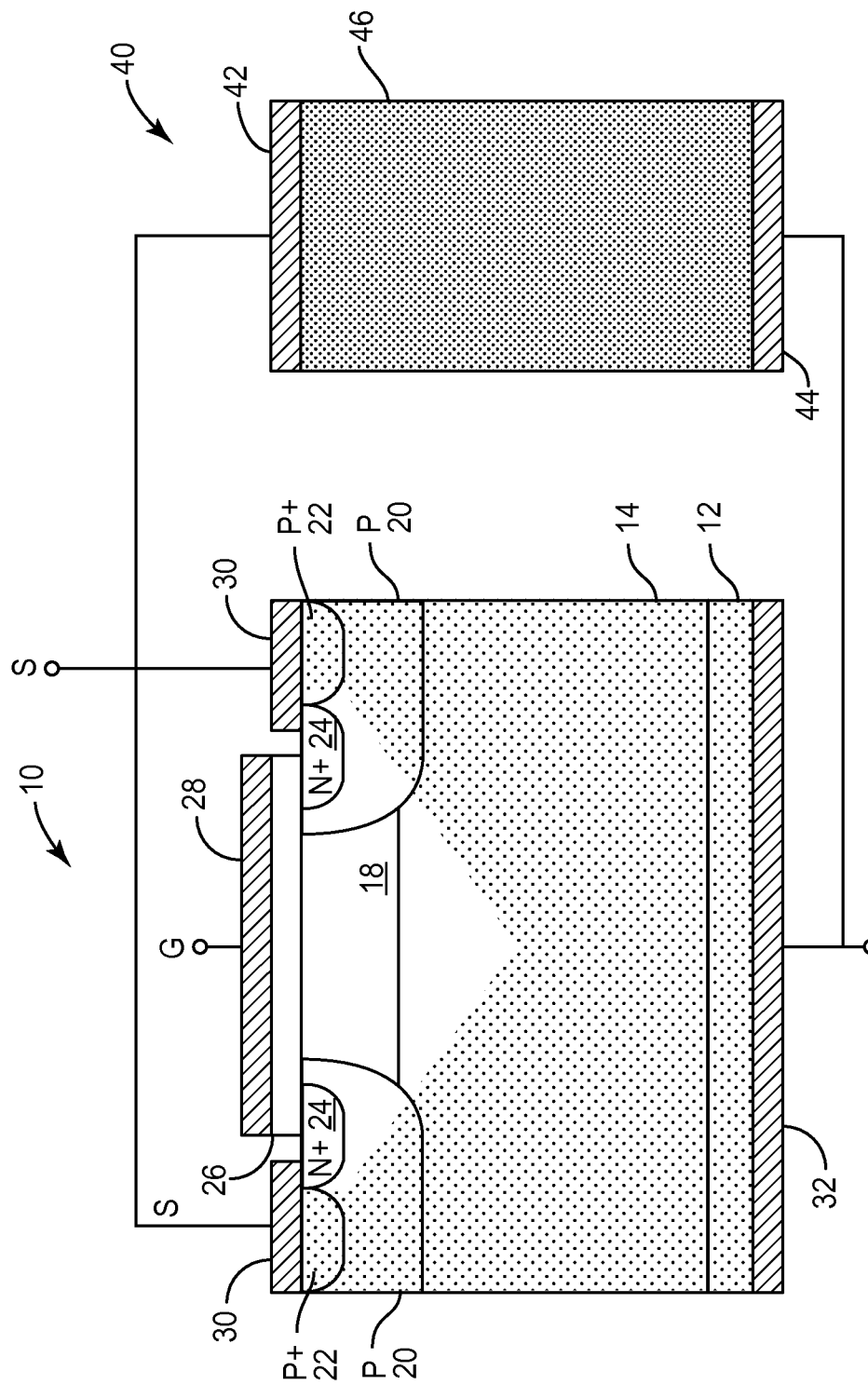
FIG. 6B shows details of the operation of the conventional power MOSFET device and attached external bypass diode when the device is operating in the third quadrant.
Figure 8:
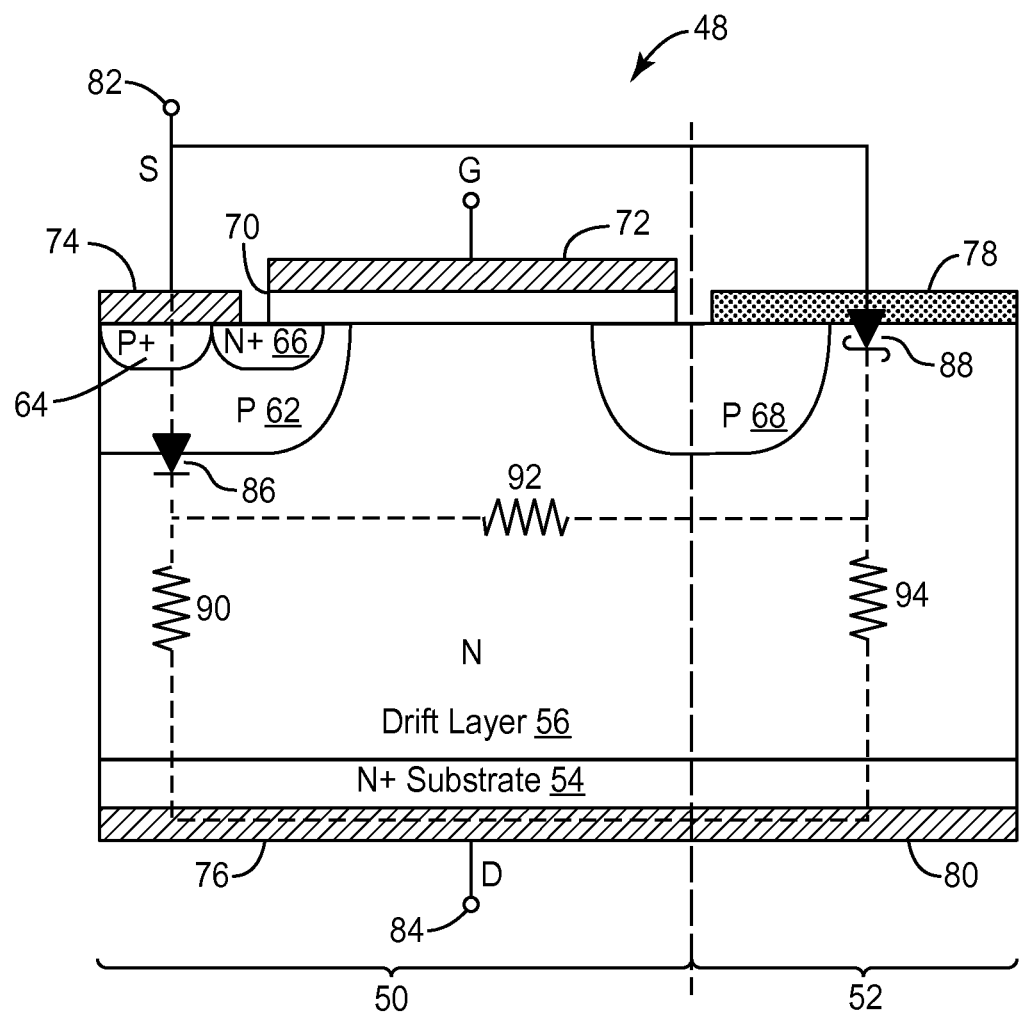
FIG. 8 shows details of the vertical FET device shown in FIG. 5 according to one embodiment of the present disclosure.

FIG. 8 shows the semiconductor device 48 including a simplified circuit diagram representing electrical components within each of the vertical FET device 50 and the bypass diode 52. As shown in FIG. 6, the vertical FET device 50 includes a P-N junction 86 formed by the junction between the first deep well region 62 and the drift layer 56, a Schottky diode 88 formed by the junction between the anode 78 of the bypass diode 52 and the drift layer 56, a first vertical drift resistor 90 representative of the vertical resistance of the drift layer 56 below the first deep well region 62, a lateral drift resistor 92 representative of the lateral resistance of the drift layer 56 between the bypass diode 52 and the furthest edge of the junction between the first deep well region 62 and the drift layer 56, and a second vertical drift resistor 94 representing the vertical resistance of the drift layer 56 in the bypass diode 52. As discussed above, the purpose of the bypass diode 52 is to prevent the P-N junction 86 from entering a forward bias mode of operation so that the vertical FET device 50 does not conduct current through the P-N junction 86. This is accomplished by maintaining the potential of the portion of the drift layer 56 below the first deep well region 62 at a level such that the barrier voltage of the P-N junction 86 is not exceeded.

As will be appreciated by those of ordinary skill in the art, the resistance of the lateral drift resistor 92 is dictated at least in part by the lateral distance between the bypass diode 52 and the furthest edge of the junction between the first deep well region 62 and the drift layer 56. Further, the resistance of the first vertical drift resistor 90 is dictated at least in part by the vertical distance between the bottom of the first deep well region 62 and the drain contact 76. Finally, the resistance of the second vertical drift resistor 94 is dictated at least in part by the vertical distance between the anode 78 and the cathode 80 of the bypass diode 52. The bypass diode 52 is placed such that the potential generated across the first vertical drift resistor 90 ensures that the P-N junction 86 does not enter a forward bias mode of operation. This is accomplished by ensuring that the voltage difference between the potential presented at the source contact 74 and the potential across the vertical drift resistor is less than the barrier voltage of the P-N junction 86.

As will be appreciated by those of ordinary skill in the art, the first vertical drift resistor 90 and the lateral drift resistor 92 form a voltage divider. As described above, the dimensions of the drift layer 56 will dictate the resistance of each one of the first vertical drift resistor 90 and the lateral drift resistor 92. By keeping the lateral distance between the bypass diode 52 and the furthest edge of the junction between the first deep well region 62 and the drift layer 56 low, the majority of the voltage placed across the bypass diode 52 can be distributed across the first vertical drift resistor 90, thereby fixing the potential below the junction such that the P-N junction 86 does not enter a forward bias mode of operation. In one exemplary embodiment, the lateral distance between the bypass diode 52 and the furthest edge of the junction between the first deep well region and the drift layer 56 is between about 5-15 microns.

Figure 9A:
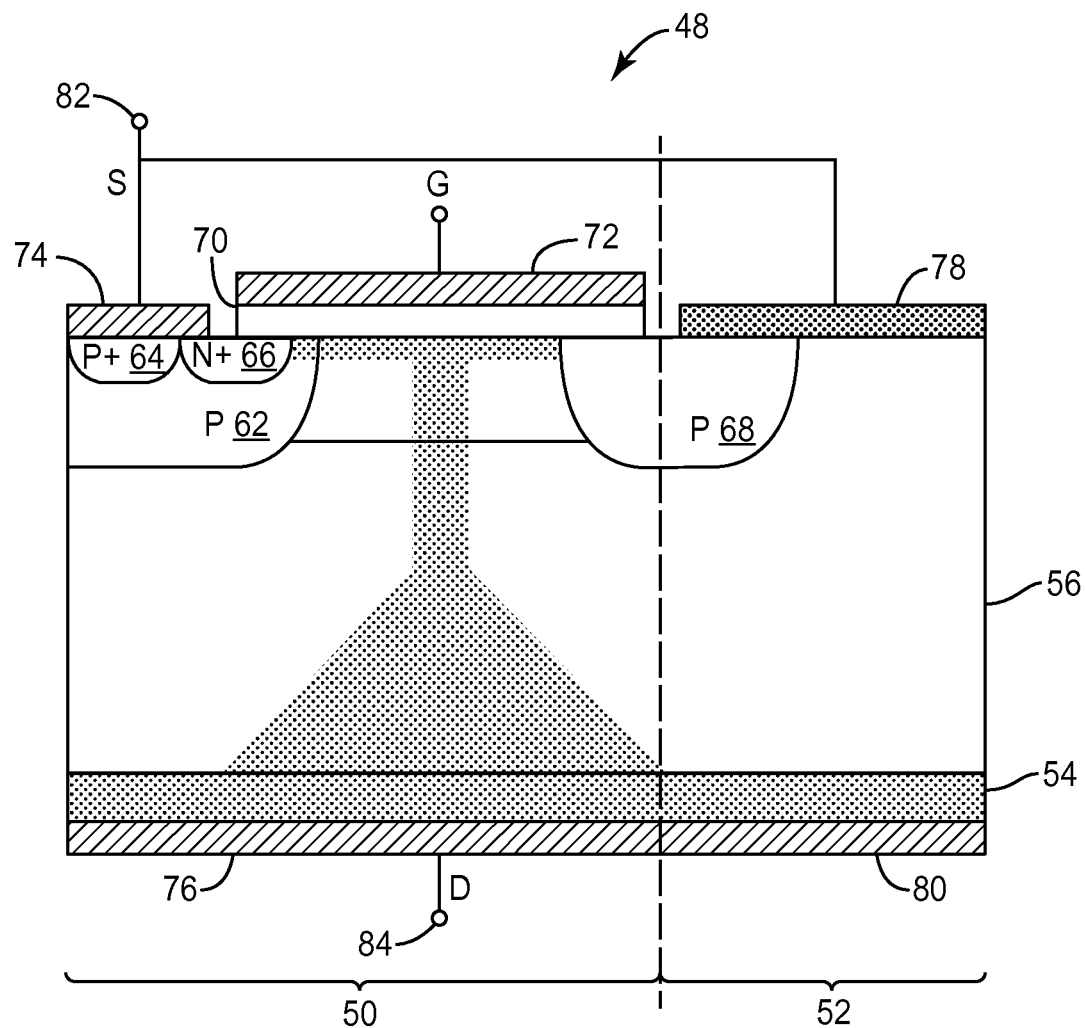
FIG. 9A shows details of the operation of the vertical FET device shown in FIG. 5 according to one embodiment of the present disclosure.

FIG. 9A shows operation of the semiconductor device 48 when the vertical FET device 50 is in an ON state (first quadrant) of operation and the bypass diode 52 is in a reverse bias state of operation. When a positive voltage is applied to the drain contact 76 of the vertical FET device 50 relative to the source contact 74 and the gate voltage increases above the threshold voltage, the vertical FET device 50 is placed in an ON state (first quadrant) of operation. Further, the bypass diode 52 is placed in a reverse bias state of operation. Accordingly, current is allowed to flow from the drain contact 76 to the source contact 74 of the device. An electric field presented by the junctions formed between the first deep well region 62 and the drift layer 56 and the second deep well region and the drift layer 56, respectively, constrict current flow into a channel. At a certain vertical distance form the first deep well region 62 and the second deep well region 68 when the electric fields are diminished, current begins to laterally spread to fill the drift layer 56. Because the bypass diode 52 is reverse biased, current does not flow through the device.

Figure 9B:
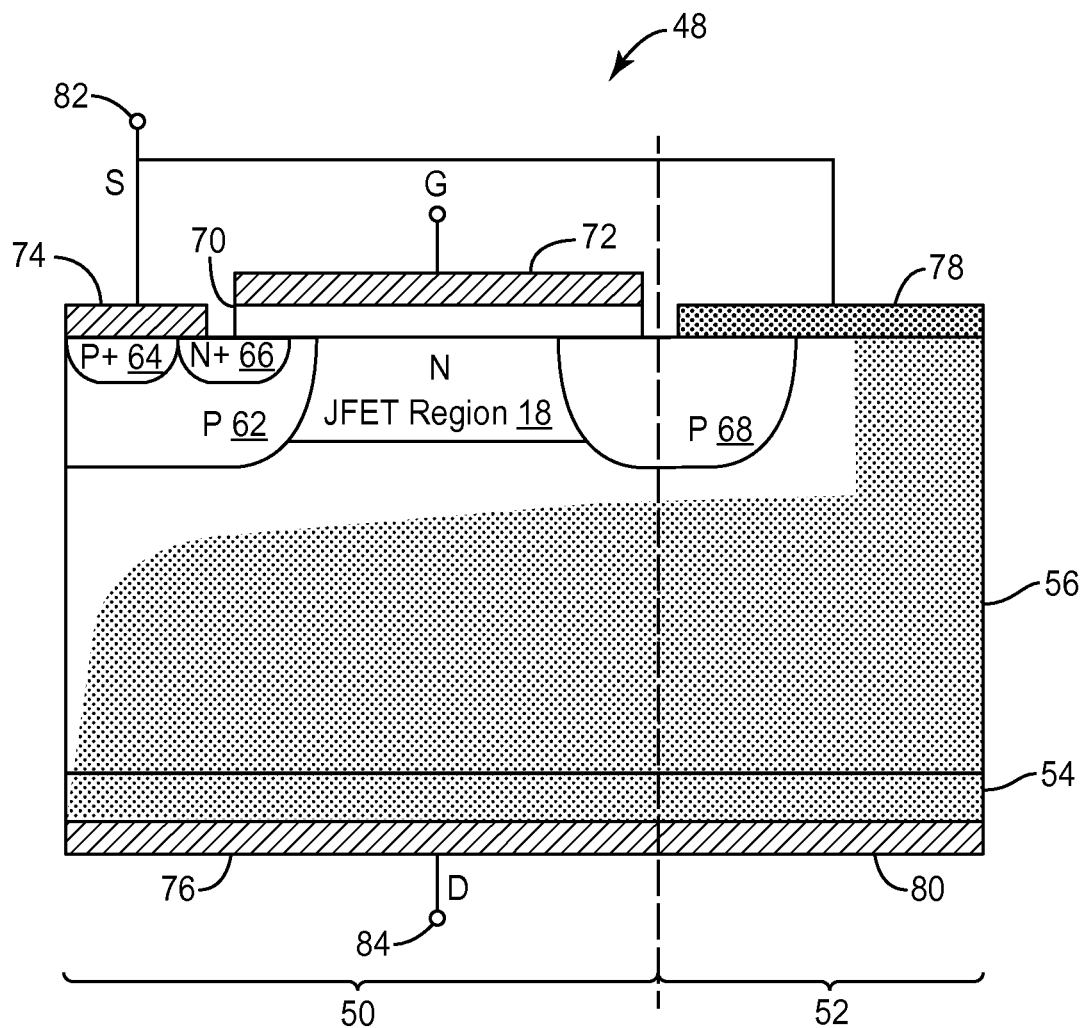
FIG. 9B shows details of the operation of the vertical FET device shown in FIG. 5 according to one embodiment of the present disclosure.

FIG. 9B shows operation of the semiconductor device 48 when the vertical FET device 50 is operating in the third quadrant and the bypass diode 52 is in a forward bias state of operation. When a bias voltage below the threshold voltage of the vertical FET device 50 is applied to the gate contact 72, and a positive voltage is applied to the source contact 74 of the semiconductor device 48 relative to the drain contact 76, current begins to flow from the anode 78 of the bypass diode 52 through the drift layer 56 to the cathode 80 of the bypass diode 52 and the drain contact 76 of the vertical FET device 50. As shown in FIG. 9, as the current flows from the anode 78 of the bypass diode 52 into the drift layer 56, it is constricted into a channel by the electric field presented by the second deep well region 68. At a certain vertical distance from the second deep well region 68 when the electric field is diminished, current begins to laterally spread to fill the drift layer 56. The spreading current creates a potential voltage between each point in the drift layer 56 and the drain contact 76. As discussed above, the bypass diode 52 is placed such that the difference between the potential just below the P-N junction formed between the first deep well region 62 and the drift layer 56 and the potential presented at the source contact 74 is less than the barrier voltage of the P-N junction. Accordingly, the P-N junction formed between the first deep well region 62 and the drift layer 56 does not enter a forward bias mode of operation, thereby preventing current flow through the P-N junction. By preventing current flow through the P-N junction formed between the first deep well region 62 and the drift layer 56, stacking faults are prevented from being formed in the drift layer 56. Accordingly, the longevity and performance of the semiconductor device 48 is improved.

Figure 10:
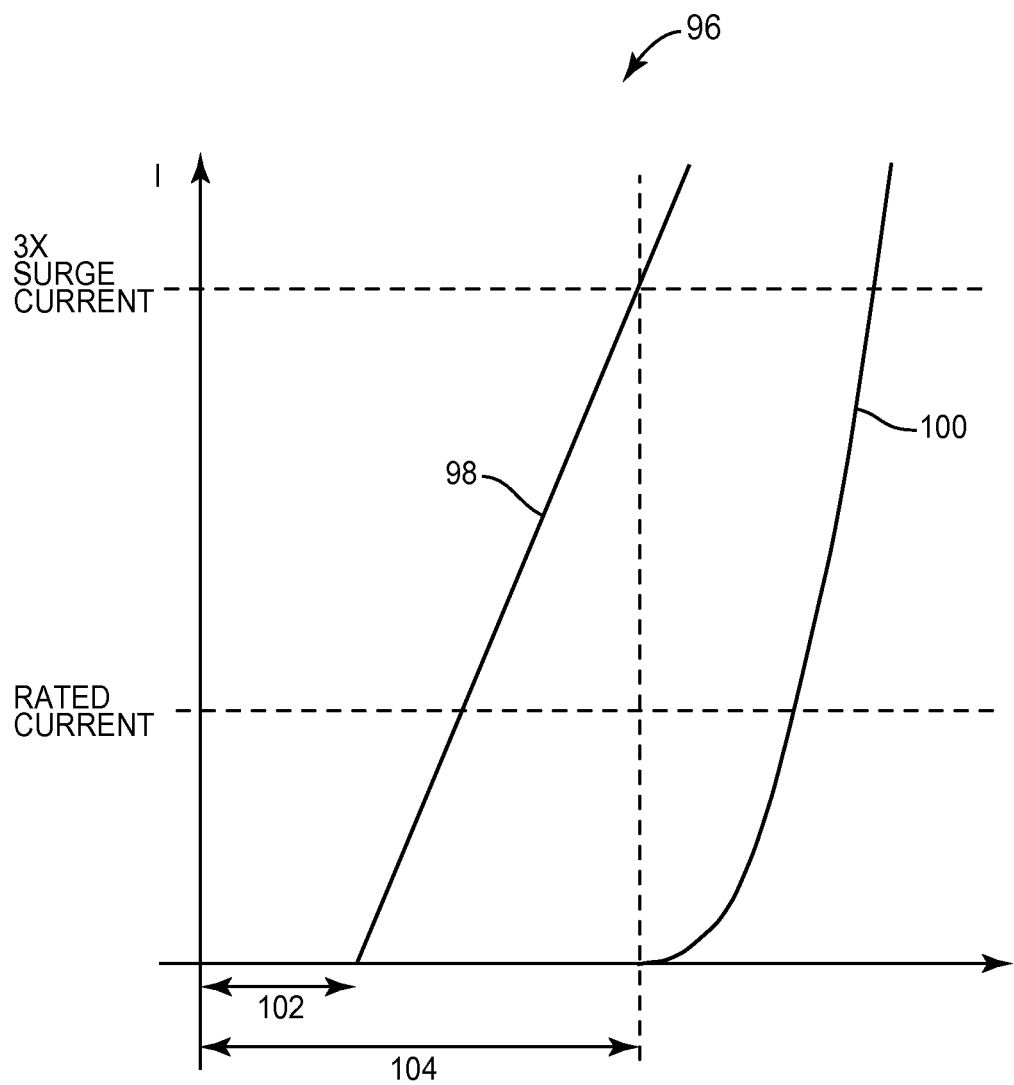
FIG. 10 is a graph illustrating the voltage and current (V-I) characteristics of the vertical FET device shown in FIG. 5 according to one embodiment of the present disclosure.

FIG. 10 shows a graph 96 illustrating voltage-to-current characteristics of the bypass diode 52 and the P-N junction formed between the first deep well region 62 and the drift layer 56 in the vertical FET device 50. In FIG. 10, a first curve 98 represents the voltage-to-current relationship of the bypass diode 52. Further, a second curve 100 represents the voltage-to-current relationship of the P-N junction formed between the first deep well region 62 and the drift layer 56. At a barrier voltage 102 of the bypass diode 52, the bypass diode 52 will begin conducting current in a linear fashion. Further, at a barrier voltage 104 of the P-N junction formed between the first deep well region 62 and the drift layer 56, the P-N junction will also begin conducting current. The concepts disclosed herein are directed towards ensuring that the bypass diode 52, and not the P-N junction formed between the first deep well region 62 and the drift layer 56, conducts all of the current flowing between the source contact 74 and the drain contact 76 of the semiconductor device 48 when the vertical FET device 50 is operating in the third quadrant, such that the bypass diode 52 conducts all of the current up to at least three times the rated current of the vertical FET device 50.

Figure 11:
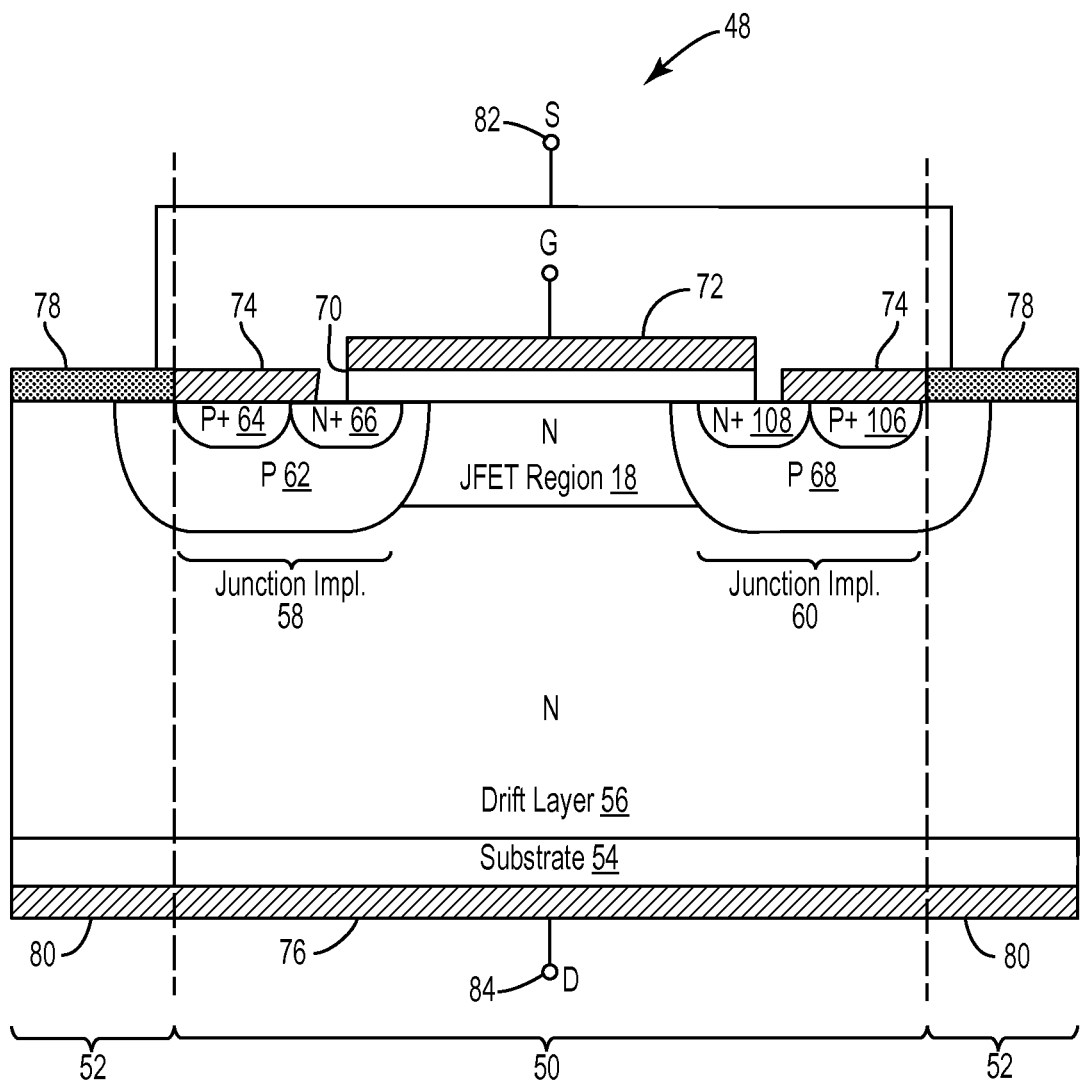
FIG. 11 shows a schematic representation of the vertical FET device and bypass diode according to an additional embodiment of the present disclosure.

FIG. 11 shows an alternative embodiment of the semiconductor device 48, wherein the vertical FET device 50 is a full-cell MOSFET, and the semiconductor device 48 includes two bypass diodes 52. As shown in FIG. 11, the semiconductor device 48 according to this embodiment is substantially similar to that shown in FIGS. 7-9, but further includes a second base region 106, a second source region 108, and an additional bypass diode 52. The second base region 106 is formed in a shallow portion on the surface of the drift layer 56 opposite the substrate 54 within the boundaries of the second deep well region 68. The second source region 108 is formed adjacent to the second base region 106 in a shallow portion on the surface of the drift layer 56 opposite the substrate 54 within the boundaries of the second deep well region 68. The bypass diodes 52 are Schottky diodes formed adjacent to both the first junction implant 58 and the second junction implant 60, respectively. By including two bypass diodes 52, the distance between each one of the P-N junctions formed between the first deep well region 62 and the drift layer 56 and the second deep well region 68 and the drift layer 56 and the closest one of the bypass diodes 52 may be further reduced when compared with the embodiment shown in FIGS. 7-9. Accordingly, the size of each one of the bypass diodes 52 may also be reduced while maintaining similar performance characteristics of the semiconductor device 48.

The semiconductor device 48 shown in FIG. 11 will function in a substantially similar manner to that shown in FIGS. 7-9. When the vertical FET device 50 is in an OFF state of operation, current will not flow from the input node 82 to the output node 84 of the device. However, when the device is operating in the third quadrant, current will flow through the bypass diodes 52 and into the drift layer 56, such that a potential below each one of the P-N junctions formed between the source contact 74 and the drain contact 76 prevents the respective P-N junctions from entering a forward bias mode of operation. Accordingly, stacking faults are not formed in the drift layer 56 of the vertical FET device 50, and the performance and longevity of the device is improved.

Although only two different structures are shown for the vertical FET device 50 in FIGS. 7-9 and 11, those of ordinary skill in the art will appreciate that the principles of the present disclosure may be applied to any vertical FET device structure without departing from the principles of the present disclosure.

Figure 12:
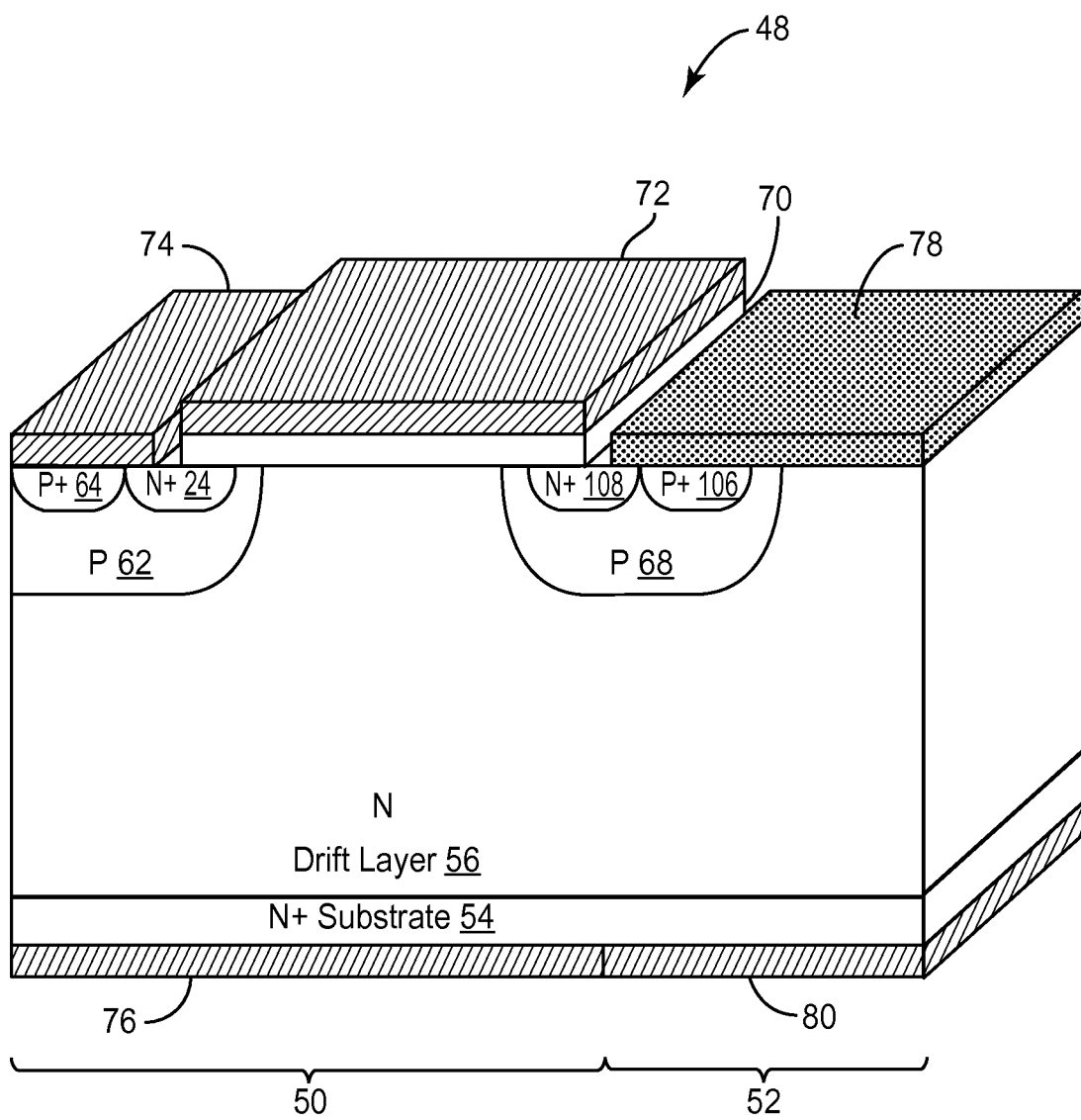
FIG. 12 shows a three-dimensional representation of the vertical FET device and bypass diode according to one embodiment of the present disclosure.
Figure 13:
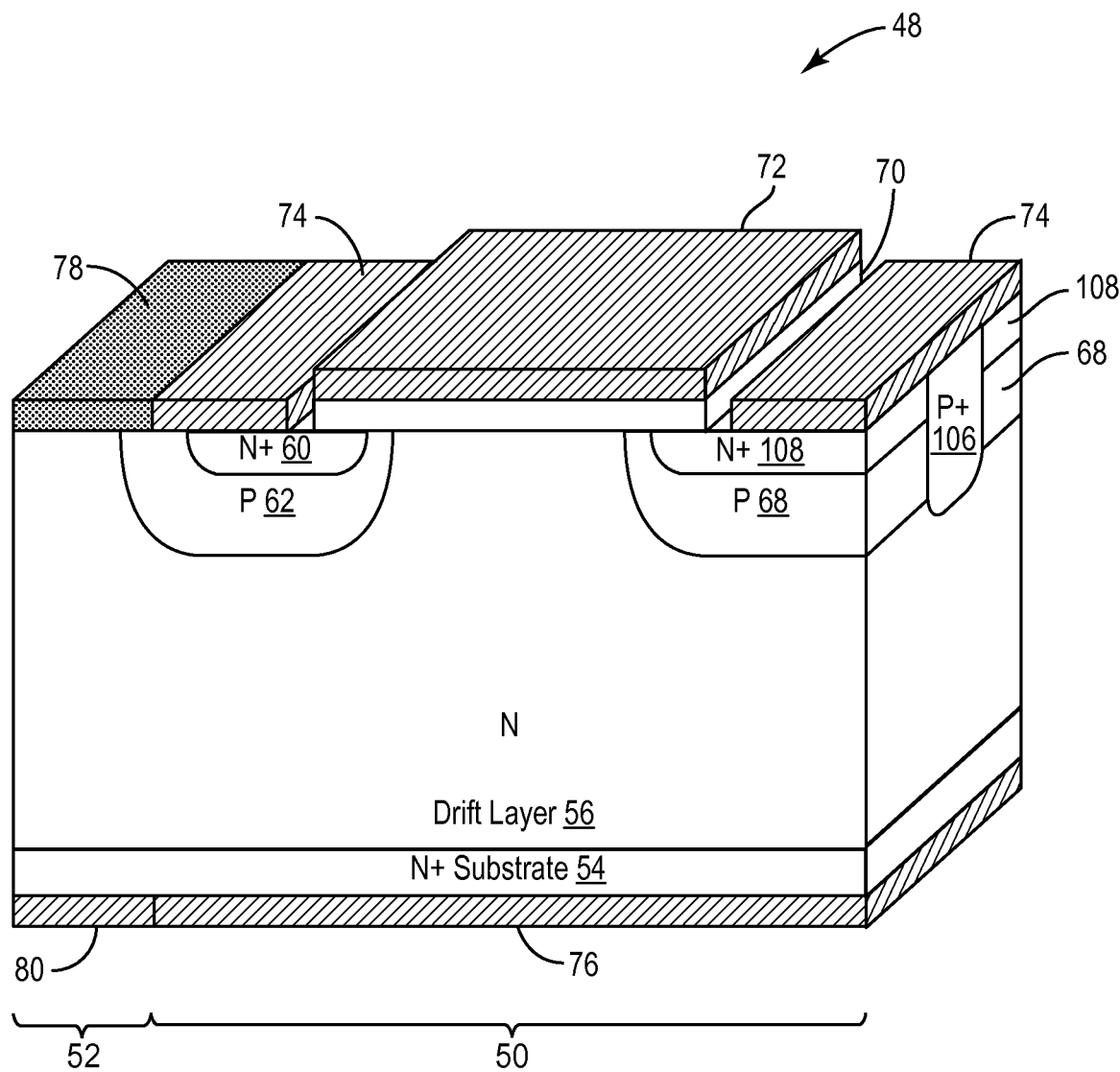
FIG. 13 shows a three-dimensional representation of the vertical FET device and bypass diode according to an additional embodiment of the present disclosure.

FIGS. 12-14 illustrate a variety of exemplary layouts for integrating the bypass diode 52 together with the vertical FET device 50 in the semiconductor device 48. FIG. 12 shows a three-dimensional diagram of the semiconductor device 48 according to one embodiment of the present disclosure. As shown in FIG. 12, the vertical FET device 50 is a full-cell MOSFET, which is substantially similar to that shown in FIG. 11. The bypass diode 52 is integrated adjacent to the vertical FET device 50. The bypass diode 52 includes the anode 78 on the surface of the drift layer 56 opposite the substrate 54, which partially overlaps a portion of the second deep well region 68, the second base region 106, and the second source region 108. Notably, the layout of the components of the semiconductor device 48 shown in FIG. 12 remain substantially the same as it extends into the page. Although the described layout will effectively prevent stacking faults from forming in the vertical FET device 50 as described above, the placement of the bypass diode 52 is inefficient, as it consumes a large amount of real estate in the semiconductor device 48 and results in the replacement of MOSFET channel area of the vertical FET device 50 with Schottky metal for the anode 78 of the bypass diode 52. Accordingly, a smaller number of the semiconductor devices 48 can be tiled onto a single semiconductor die, thereby reducing the performance and increasing the costs associated with producing such a die.

FIG. 13 shows a three-dimensional diagram of the semiconductor device 48 according to an additional embodiment of the present disclosure. FIG. 13 is substantially similar to FIG. 12, except that the first base region 64 and the second base region 106 have been moved into the third dimension, such that the first base region 64 and the second base region 106 are located some distance from a front face 110 of the semiconductor device 48. By moving the first base region 64 and the second base region 106 into the third dimension, the overall cell pitch of the semiconductor device 48 can be reduced without impacting the performance of the device. Accordingly, more semiconductor devices can be integrated onto a single die, thereby improving the performance and costs associated with producing such a die. Even though the layout shown in FIG. 13 is more efficient than that shown in FIG. 12, the bypass diode 52 is still inefficiently placed, as it consumes a large amount of real estate in the semiconductor device 48 and results in the replacement of MOSFET channel area of the vertical FET device 50 with Schottky metal for the anode 78 of the bypass diode 52, as discussed above.

Figure 14A:
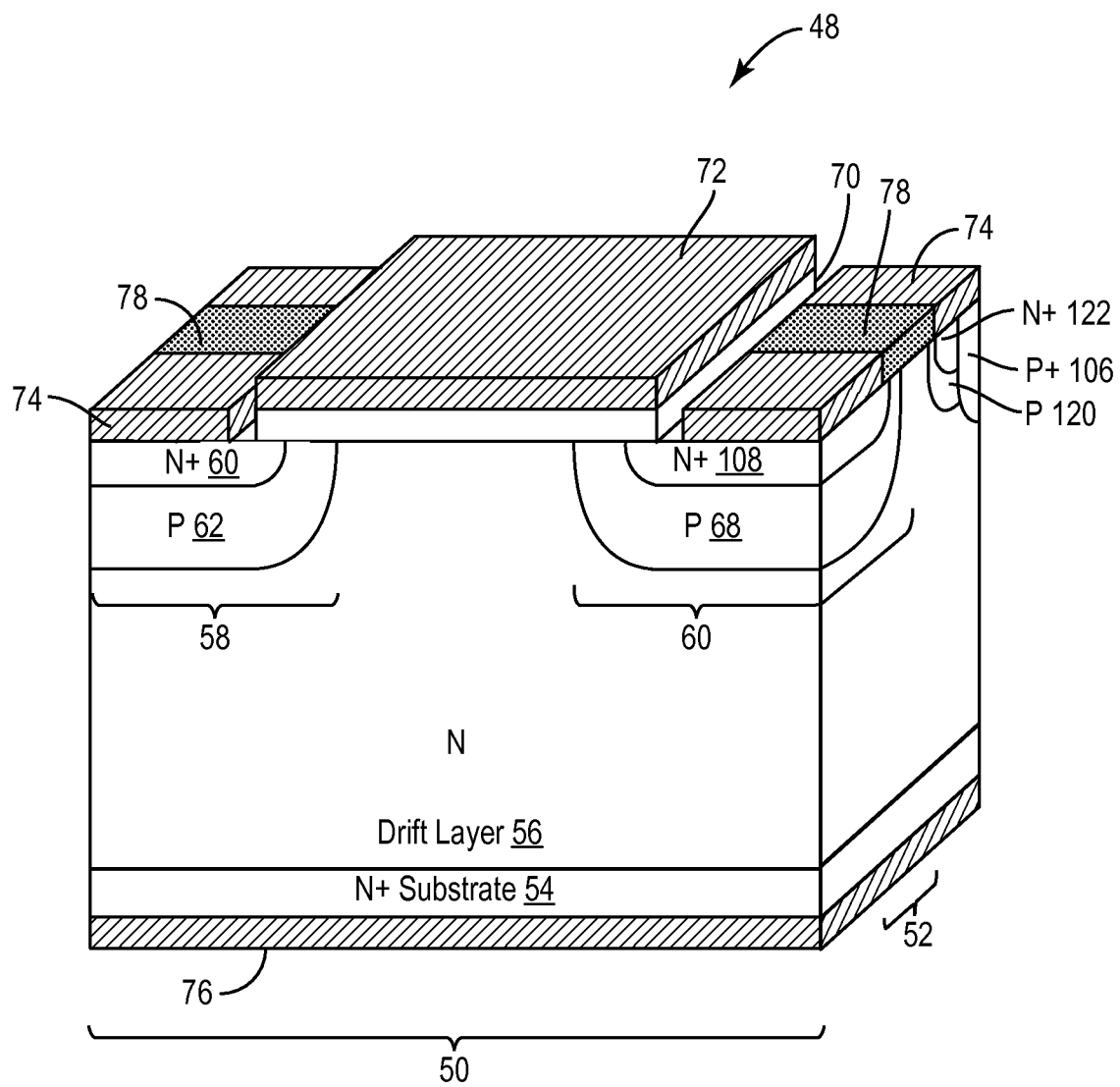
FIGS. 14A and 14B show a three-dimensional representation of the vertical FET device and bypass diodes according to an additional embodiment of the present disclosure.
Figure 14B:
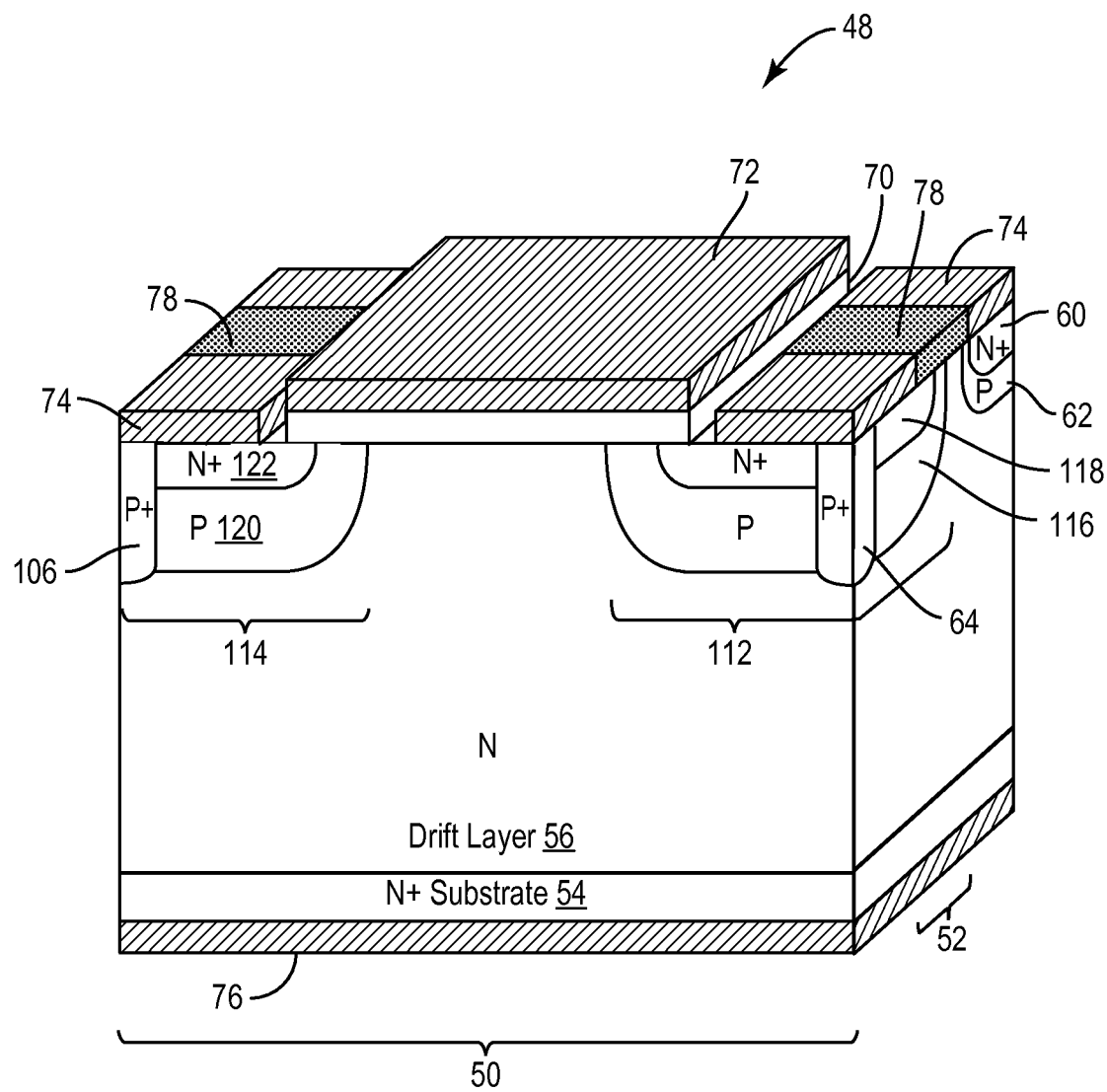

FIGS. 14A and 14B show a three-dimensional diagram of the semiconductor device 48 according to an additional embodiment of the present disclosure. As shown in FIGS. 14A and 14B, the vertical FET device 50 is a full-cell MOSFET, and the semiconductor device 48 includes two bypass diodes 52. Additionally, the first base region 64, the second base region 106, and the anodes 78 for each one of the bypass diodes 52 have been moved into the third dimension, such that the first base region 64, the second base region 106, and the anodes 78 for each one of the bypass diodes 52 are located some distance away from the front face 110 of the semiconductor device 48, such that each one of the bypass diodes 52 occupies only a portion of the depth of the semiconductor device 48.

Further, the first deep well region 62, the second deep well region 68, the first source region 66, and the second source region 108 are segmented in the third dimension in order to create a space for the anodes 78 of the bypass diodes 52 to directly contact the drift layer 56 at some distance away from the front face 110 of the semiconductor device 48 in order to form the bypass diodes 52. Accordingly, the first junction implant 58 and the second junction implant 60 are effectively further broken into a third junction implant 112 and a fourth junction implant 114, respectively, such that each one of the junction implants 112, 114 is located in a corner of the surface of the drift layer 56 opposite the substrate 54, extending downward toward the substrate 54 and inward towards the center of the surface of the drift layer 56 opposite the substrate 54. The third junction implant 112 includes a third deep well region 116, a third source region 118, and the first base region 64. The fourth junction implant 114 includes a fourth deep well region 120, a fourth source region 122, and the second base region 106.

Arranging the semiconductor device 48 as described above allows the bypass diodes 52 to be implemented without sacrificing MOSFET channel area in the vertical FET device 50. Further, the described arrangement allows the maximum distance between the furthest edge of each P-N junction between the source contact 74 and the drain contact 76 of the vertical FET device 50 and each bypass diode 52 to depend on the depth of the first source region 66 and the deep well region 68, rather than the total cell pitch. Accordingly, a larger number of the semiconductor devices 48 may be tiled onto a single semiconductor die, thereby increasing the performance and decreasing the cost associated with such a die.

FIGS. 15A-15E and FIG. 16 illustrate a process for manufacturing the semiconductor device 48 shown in FIGS. 14A and 14B according to one embodiment of the present disclosure. First, the drift layer 56 is epitaxially grown on a surface of the substrate 54 (step 200 and FIG. 15A). Next, the first deep well region 62, the second deep well region 68, the third deep well region 116, and the fourth deep well region 120 are implanted in the surface of the drift layer 56 opposite the substrate 54 (step 202 and FIG. 15B). In order to achieve the depth required for the first deep well region 62, the second deep well region 68, the third deep well region 116, and the fourth deep well region 120, a two-step ion implantation process may be used, wherein boron is used to obtain the necessary depth, while aluminum is used to obtain desirable conduction characteristics of the respective deep well regions. The first base region 64 and the second base region 106 are then implanted (step 204 and FIG. 15C). Next, the first source region 66, the second source region 108, the third source region 118, and the fourth source region 122 are implanted (step 206 and FIG. 15D). The first deep well region 62, the second deep well region 68, the third deep well region 116, the fourth deep well region 120, the first base region 64, the second base region 106, the first source region 66, the second source region 108, the third source region 118, and the fourth source region 122 may be implanted via an ion implantation process. Those of ordinary skill will appreciate that the aforementioned regions may be created by any suitable process without departing from the principles of the present disclosure.

Figure 15A:
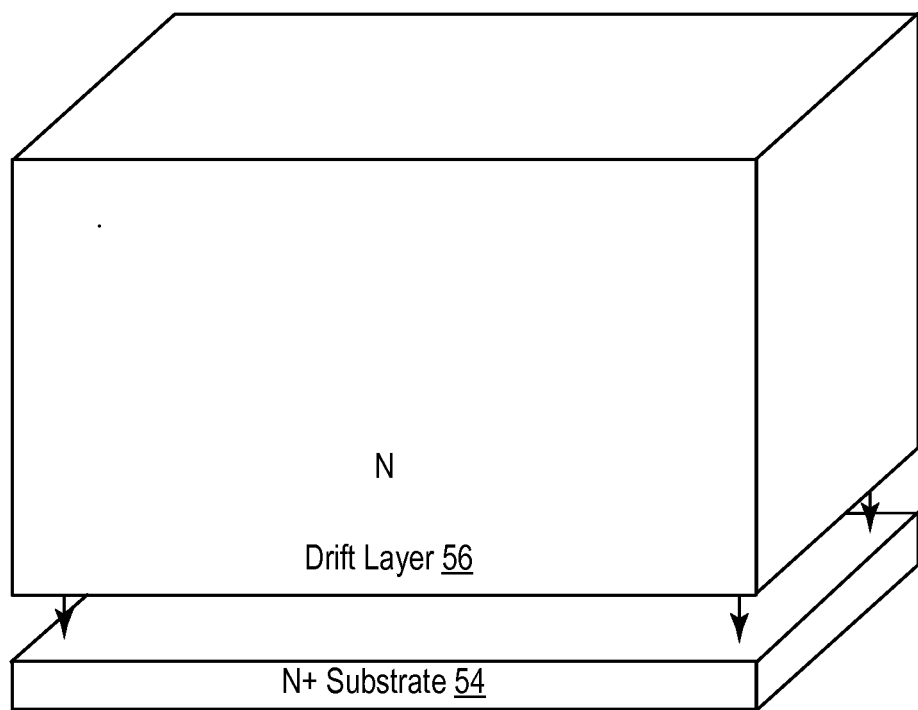
FIGS. 15A-15E illustrate a process for manufacturing the vertical FET device and bypass diodes shown in FIGS. 14A and 14B.
Figure 15B:
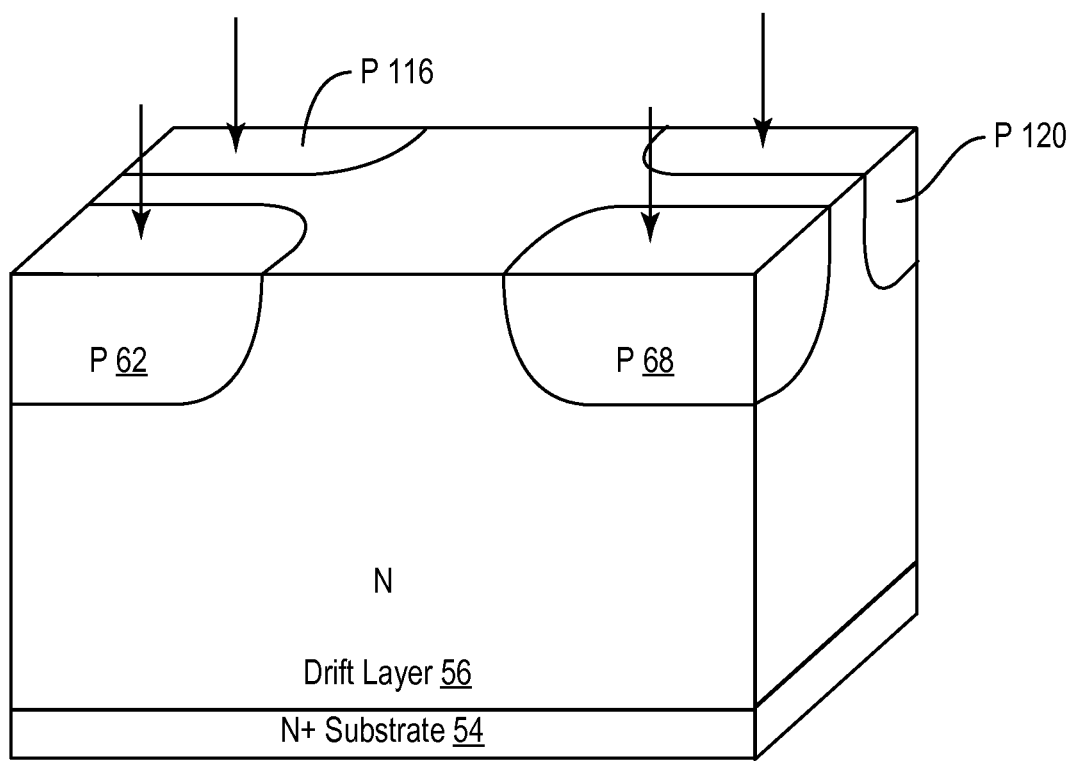
Figure 15C:
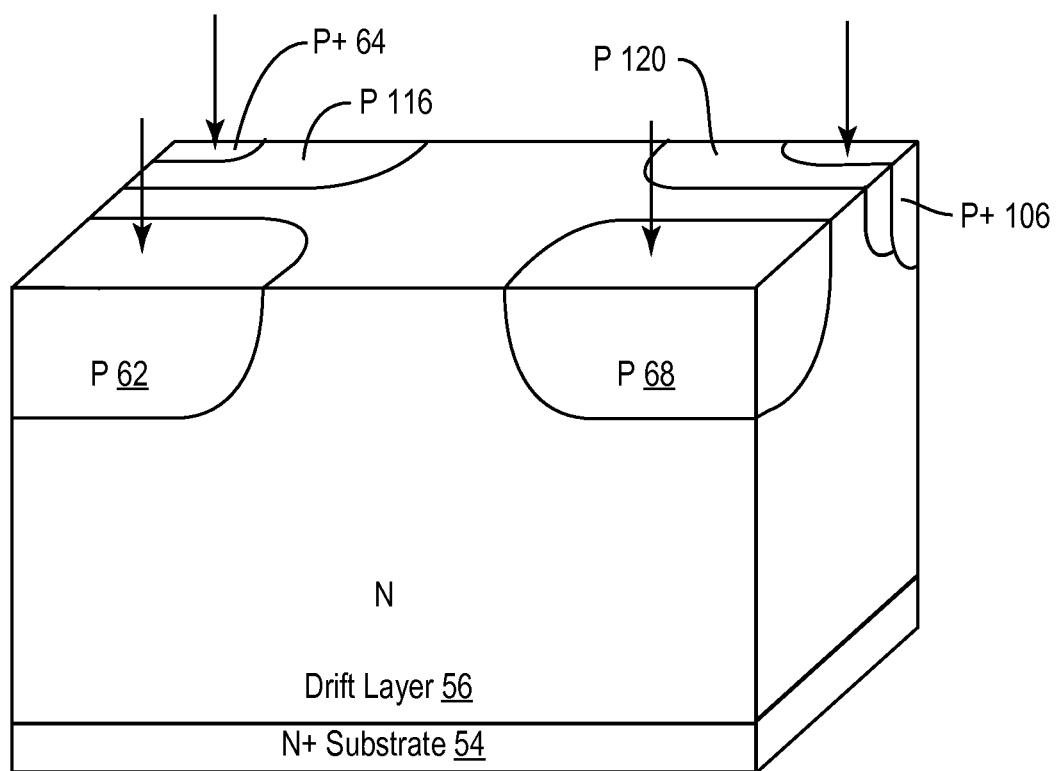
Figure 15D:
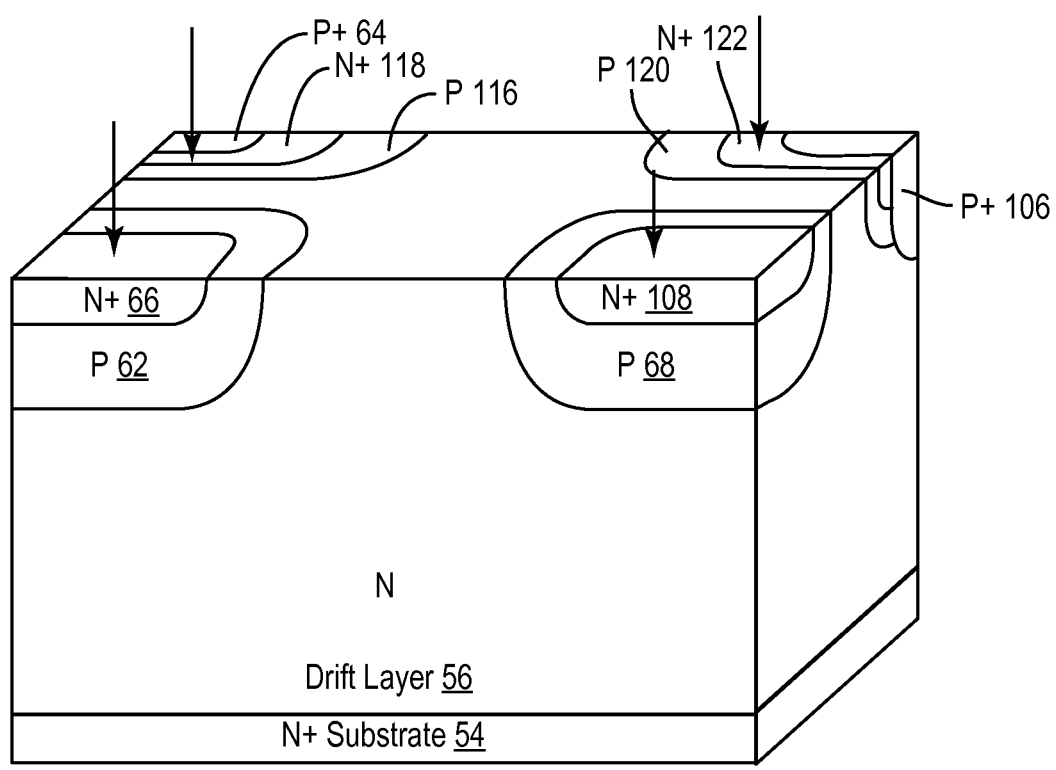
Figure 15E:
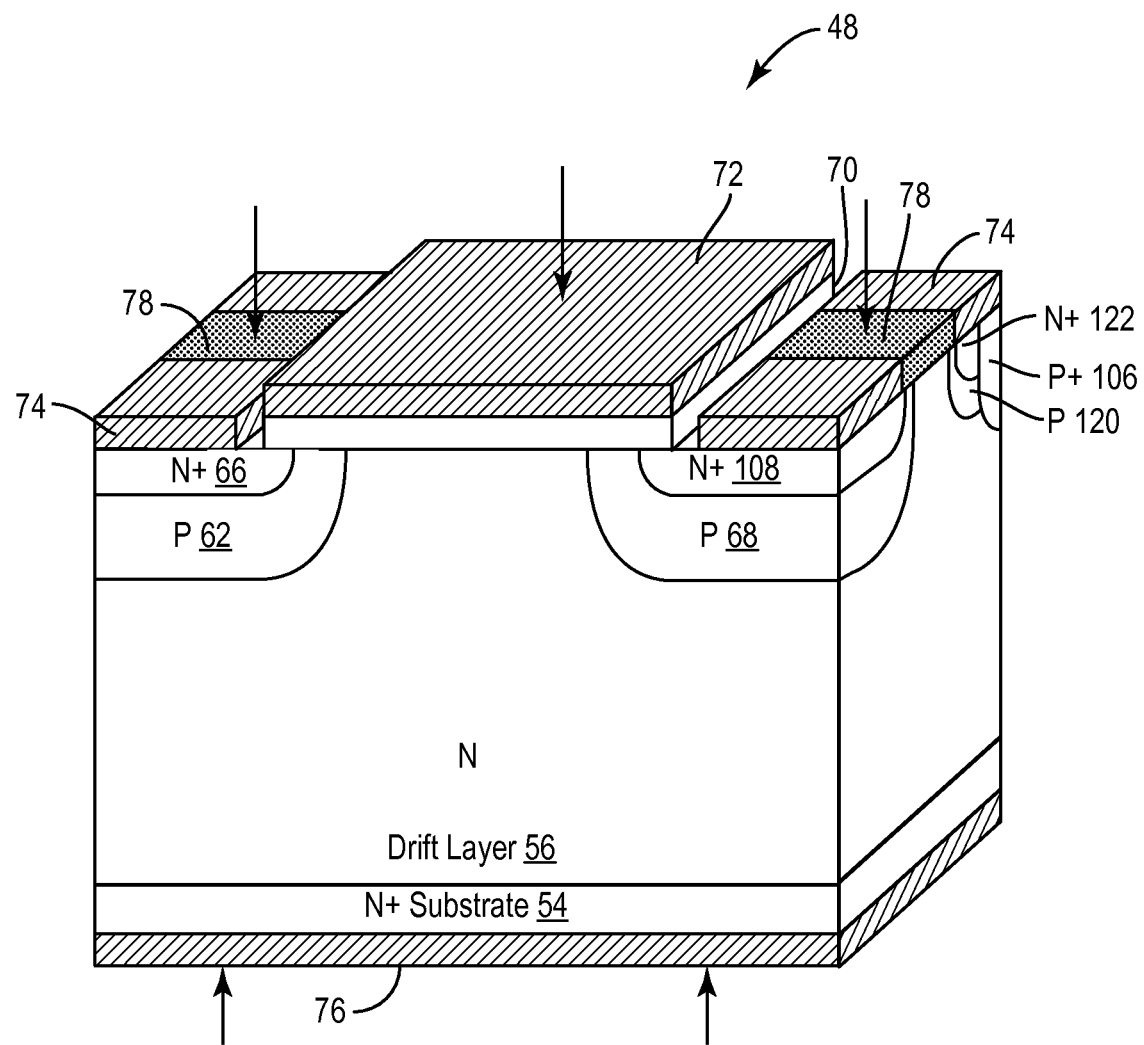
Figure 16:
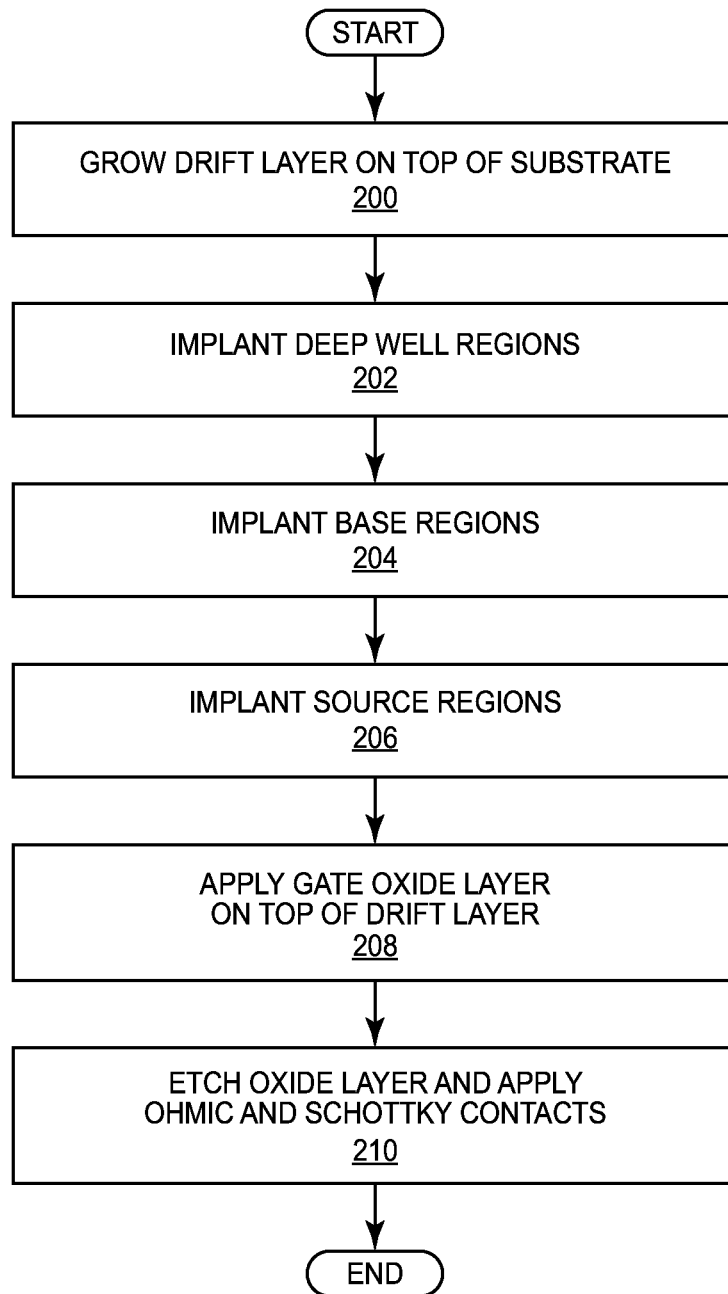
FIG. 16 is a diagram showing the process for manufacturing the vertical FET device and bypass diodes shown in FIGS. 15A-15E.

Next, the gate oxide layer 70 is applied to the surface of the drift layer 56 opposite the substrate 54 (step 208 and FIG. 15E). The gate oxide layer 70 is then etched and the ohmic contacts (the gate contact 72, the source contacts 74, and the drain contact 76) and the anodes 78 are attached to the semiconductor device 48 (step 210 and FIG. 15E). An over-mold layer may be provided over the surface of the drift layer 56 opposite the substrate 54 in order to protect the contacts of the semiconductor device 48.

Those skilled in the art will recognize improvements and modifications to the embodiments of the present disclosure. All such improvements and modifications are considered within the scope of the concepts disclosed herein and the claims that follow.

What is claimed is:

1. A semiconductor device comprising:
    a substrate;
    a drift layer on the substrate;
    a vertical metal-oxide-semiconductor field-effect transistor (MOSFET) comprising:
        at least four junction implants in the drift layer opposite the substrate such that the at least four junction implants are separated from one another by a portion of the drift layer;
        a gate oxide layer on the drift layer opposite the substrate such that the gate oxide layer at least partially overlaps each one of the at least four junction implants;
        a gate contact on the gate oxide layer;
        source contacts on the drift layer and above each of the at least four junction implants; and
        a drain contact on the substrate; and
    junction barrier Schottky bypass diodes comprising a Schottky contact separate from the source contacts on the drift layer opposite the substrate such that the Schottky contact only partially overlaps and runs between two of the at least four junction implants, and is laterally disposed between the source contacts.

2. The semiconductor device of claim 1 wherein a total area of each junction barrier Schottky bypass diode of the junction barrier Schottky bypass diodes is between 1.0 μm² and 10.0 μm².

3. The semiconductor device of claim 1 wherein the substrate and the drift layer comprise silicon carbide.

4. A semiconductor device comprising:
    a substrate;
    a drift layer on the substrate;
    a vertical metal-oxide-semiconductor field-effect transistor (MOSFET) comprising:
        at least four junction implants in the drift layer opposite the substrate such that the at least four junction implants are separated from one another by a portion of the drift layer;
        a gate oxide layer on the drift layer opposite the substrate such that the gate oxide layer at least partially overlaps each one of the at least four junction implants;
        a gate contact on the gate oxide layer;
        source contacts on the drift layer and above each of the at least four junction implants; and
        a drain contact on the substrate;
    a first junction barrier Schottky bypass diode comprising a first Schottky contact separate from the source contacts on the drift layer opposite the substrate such that the first Schottky contact only partially overlaps and runs between two of the at least four junction implants, and is disposed between the source contacts; and
    a second junction barrier Schottky bypass diode comprising a second Schottky contact separate from the source contacts on the drift layer opposite the substrate such that the second Schottky contact only partially overlaps and runs between two of the at least four junction implants, and is laterally disposed between the source contacts.

5. The semiconductor device of claim 4 wherein:
    a doping concentration of the substrate is between about $1 \times 10^{18}$ cm$^{-3}$ and $1 \times 10^{20}$ cm$^{-3}$; and
    a doping concentration of the drift layer is between about $3 \times 10^{14}$ cm$^{-3}$ and $1.5 \times 10^{16}$ cm$^{-3}$.

6. The semiconductor device of claim 4 wherein the first Schottky contact and the second Schottky contact comprise a low barrier height Schottky metal.

7. The semiconductor device of claim 4 wherein a total area of the first junction barrier Schottky bypass diode and the second junction barrier Schottky bypass diode is between 1.0 μm² and 10.0 μm².

8. The semiconductor device of claim 4 wherein the substrate and the drift layer comprise silicon carbide.

9. A method for manufacturing a semiconductor device comprising:
    providing a substrate;
    providing a drift layer on the substrate;
    providing a vertical metal-oxide-semiconductor field-effect transistor (MOSFET) by: implanting at least four junction implants in the drift layer opposite the substrate such that the at least four junction implants are separated from one another by a portion of the drift layer;
    providing a gate oxide layer on the drift layer opposite the substrate such that the gate oxide layer at least partially overlaps each one of the at least four junction implants;
    providing a gate contact on the gate oxide layer;
    providing source contacts on the drift layer and above each of the at least four junction implants; and
    providing a drain contact on the substrate; and
    providing junction barrier Schottky bypass diodes by:
        providing Schottky contacts separate from the source contacts on the drift layer opposite the substrate such that each of the Schottky contacts only partially overlaps and runs between two of the at least four junction implants, and is laterally disposed between the source contacts; and providing a cathode on the substrate opposite the drift layer, wherein the cathode is coupled to the drain contact.

10. The method of claim 9 wherein:

a doping concentration of the substrate is between about $1 \times 10^{18}$ cm$^{-3}$ and $1 \times 10^{20}$ cm$^{-3}$; and a doping concentration of the drift layer is between about $3 \times 10^{14}$ cm$^{-3}$ and $1.5 \times 10^{16}$ cm$^{-3}$.

11. The method of claim 9 wherein the Schottky contacts comprise a low-barrier height Schottky metal.

* * * * *